(12) United States Patent
Teggatz et al.

(10) Patent No.: US 12,519,460 B2
(45) Date of Patent: Jan. 6, 2026

(54) POWER CONVERTERS USING PRECISE TIMING CONTROL

(71) Applicant: Ross Teggatz, The Colony, TX (US)

(72) Inventors: Ross Teggatz, The Colony, TX (US); Sridhar Ramaswamy, Plano, TX (US); Sudipto Chakraborty, Plano, TX (US)

(73) Assignee: Ross Teggatz, The Colony, TX (US)

( * ) Notice: Subject to any disclaimer, the term of this patent is extended or adjusted under 35 U.S.C. 154(b) by 97 days.

(21) Appl. No.: 18/699,191

(22) PCT Filed: Oct. 6, 2022

(86) PCT No.: PCT/US2022/045851
§ 371 (c)(1),
(2) Date: Apr. 5, 2024

(87) PCT Pub. No.: WO2023/059767
PCT Pub. Date: Apr. 13, 2023

(65) Prior Publication Data
US 2024/0405662 A1    Dec. 5, 2024

Related U.S. Application Data

(60) Provisional application No. 63/252,925, filed on Oct. 6, 2021.

(51) Int. Cl.
*H03K 5/04*    (2006.01)
*H02M 1/08*    (2006.01)
(Continued)

(52) U.S. Cl.
CPC ............... *H03K 5/04* (2013.01); *H02M 1/08* (2013.01); *H02M 3/07* (2013.01); *H02M 3/157* (2013.01);
(Continued)

(58) Field of Classification Search
None
See application file for complete search history.

(56) References Cited

U.S. PATENT DOCUMENTS 7,965,522 B1    6/2011  Hornberger et al.
9,729,139 B2    8/2017  Saski
(Continued)

FOREIGN PATENT DOCUMENTS

CN    103944372 A    7/2014
JP      6582714 B2    10/2019

OTHER PUBLICATIONS

International Search Report and Written Opinion from the Korean Intellectual Property Office for PCT/US2022/045851 dated Feb. 10, 2023, 12 pp.

*Primary Examiner* — Cassandra F Cox
(74) *Attorney, Agent, or Firm* — Daniel J. Chalker; Edwin S. Flores; Chalker Flores, LLP

(57) ABSTRACT

A power converter includes a timing control circuit, an interface, one or more switching circuits and a monitoring circuit. The one or more switching circuits generate one or more pulses in response to one or more timing signals generated by the timing control circuit. The monitoring circuit measures a delay between at least one of the one or more timing signals and at least one of the one or more pulses, and generates an output signal based on the delay. The timing control circuit adjusts the delay obtained by monitoring the output signal.

28 Claims, 17 Drawing Sheets

(51) Int. Cl.
*H02M 3/07* (2006.01)
*H02M 3/157* (2006.01)
*H03L 7/08* (2006.01)
*H03K 5/00* (2006.01)

(52) U.S. Cl.
CPC ...... *H03L 7/08* (2013.01); *H03K 2005/00019* (2013.01)

(56) References Cited

U.S. PATENT DOCUMENTS

| | | | |
|---|---|---|---|
| 10,263,510 B2* | 4/2019 | Jans | H02M 3/3385 |
| 2012/0105039 A1 | 5/2012 | Brown | |
| 2014/0217942 A1* | 8/2014 | Fukuta | H02M 7/53875 |
| | | | 318/400.27 |
| 2016/0126822 A1 | 5/2016 | Lyle et al. | |
| 2016/0329808 A1* | 11/2016 | Han | H02M 1/08 |

* cited by examiner

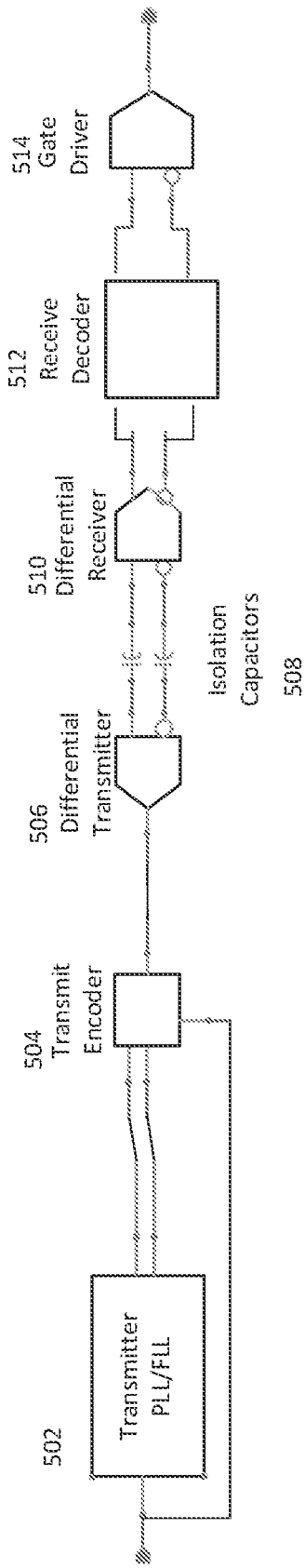
FIG. 5
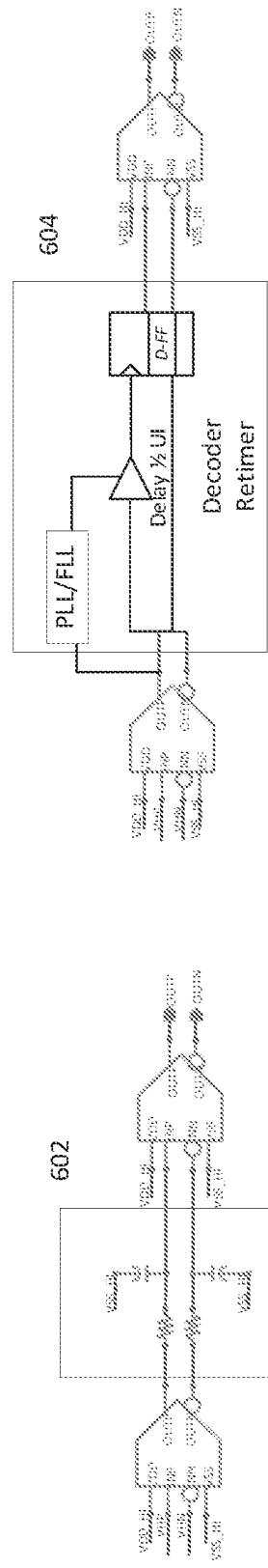
FIG. 6A
FIG. 6B

POWER CONVERTERS USING PRECISE TIMING CONTROL

CROSS-REFERENCE TO RELATED APPLICATIONS

This application is the National Stage of International Application No. PCT/US2022/045851, filed on Oct. 6, 2022, which claims priority to U.S. Provisional Patent Application No. 63/252,925, filed on Oct. 6, 2021. The contents of each of the foregoing applications are hereby incorporated by reference in their entirety.

STATEMENT OF FEDERALLY FUNDED RESEARCH

Not applicable.

TECHNICAL FIELD OF THE INVENTION

The present invention relates in general to power switching applications. In particular, the present invention relates to precisely controlling various topologies of drivers by adjusting the timing of the driver waveforms.

BACKGROUND OF THE INVENTION

There are three main isolation techniques being used in the industry: (a) optical isolation, (b) monolithic level shifters, and (c) galvanic isolation.

Optical Isolation—optocouplers can provide up to 1 kV isolation and 1 MHz switching speed. However, this technique suffers from reliability and limited flexibility with respect to propagation delay and rise/fall times. Fiber optic isolation provides unlimited voltage isolation and is fast, but it is expensive. This method does not allow energy transmission.

Monolithic level shifters—these are cost effective and allow for logic integration. However, they do not provide galvanic isolation and have high EMI sensitivity. In addition, they also suffer from high power dissipation for high voltage applications (e.g., >500V). They also don't allow energy transmission.

Galvanic Isolation includes: (a) pulse transformers, (b) coreless transformers, and (c) capacitive isolation.

Pulse transformers—allow energy transmission, however they are expensive and bulky and suffer high propagation delay.

Coreless transformers—very cost effective and can be integrated onto the driver IC but does not allow energy transmission.

Capacitive isolation—cost effective and provides high level of isolation>10 kV and can be easily integrated into the driver IC. However, it does not allow energy transmission Both optical isolation and monolithic level shifters above also provide high (several kV) isolation and can transfer gate pulses and the power supply (i.e., they don't need an independent power supply at the secondary). However, they suffer from duty cycle limitations and higher losses.

For example, state of the art solutions use the capacitive isolation solution—they use versions of ON/OFF keying to send the pulse signal across the isolation barrier and use a simple filter to decode the signal.

None of the above methods provide a feedback mechanism to fine tune the dead time and slew rate for the drivers leading to some efficiency loss.

The dead time sensing in most commercially available solutions is performed using a resistor in series with the stacked driver transistors to sense the current in the driver stack, where the voltage across the resistor is compared to a desired voltage to ensure a specific dead time for transistor reliability in the driver.

SUMMARY OF THE INVENTION

One embodiment of the present invention provides a power converter that includes a timing control circuit that generates one or more timing signals, an interface coupled to the timing control circuit, one or more switching circuits coupled to the interface that generate one or more pulses in response to the one or more timing signals, and a monitoring circuit coupled to the one or more switching circuits and the timing control circuit. The monitoring circuit measures a delay between at least one of the one or more timing signals and at least one of the one or more pulses, and generates an output signal based on the delay. The timing control circuit adjusts the delay obtained by monitoring the output signal.

In one aspect, the monitoring circuit is coupled to the timing control circuit via the interface. In another aspect, the one or more pulses vary in amplitude, voltage level, frequency, phase, or duty cycle. In another aspect, the monitoring circuit measures the delay by measuring one or more electrical or thermal characteristics. In another aspect, the one or more electrical characteristics comprise voltage amplitude, current, phase, frequency or voltage levels; and the one or more thermal characteristics comprise an electrical output from a temperature sensor. In another aspect, the monitoring circuit comprises two or more monitoring circuits that operate concurrently or sequentially. In another aspect, the one or more timing signals comprise a high side timing signal and a low side timing signal; the one or more switching circuits comprise a high side switching circuit that generates a high side pulse in response to the high side timing signal, and a low side switching circuit that generates a low side pulse in response to the low side timing signal; the delay comprises one or more delays between the high side pulse and the low side pulse, the high side pulse and the high side timing signal, or the low side pulse and the low side timing signal; and the output signal comprises one or more output signals based on the one or more delays. In another aspect, the high side pulse and the low side pulses are complementary, identical, or non-overlapping. In another aspect, the high side switching circuit and the low side switching circuit use differential circuitry. In another aspect, the timing control circuit does not adjust the timing signal until the timing control circuit reaches a steady state. In another aspect, a frequency of the one or more timing signals vary over time. In another aspect, the timing control circuit maintains a slew rate of the one or more pulses approximately equal to a desired slew rate. In another aspect, the output signal from the monitoring circuit comprises an actual dead time, an error between the actual dead time and a desired dead time, a signal or a digital code proportional to the actual dead time or a difference between the actual dead time and the desired dead time. In another aspect, the timing control circuit encodes a desired dead time, a duty cycle, or a desired slew rate into the one or more timing signals. In another aspect, the desired dead time, the duty cycle, or the desired slew rate are adjustable on demand via a controller. In another aspect, the interface comprises an isolation barrier. In another aspect, the isolation barrier comprises a capacitor circuit, an inductor circuit or a radio-frequency based transmission circuit. In another aspect, the isolation barrier comprises: a first isolation circuit coupled between the timing control circuit and the one or more switching circuits; and a second isolation circuit coupled between the monitoring circuit and the timing control circuit. In another aspect, each of the one or more switching circuits comprises a pre-driver circuit coupled to a switch. In another aspect, a load is coupled to at least one of the one or more switching circuits. In another aspect, the monitoring circuit comprises a voltage level comparator, a current level comparator, a temperature sensor, or a capacitor divider. For the driver configurations having different voltage levels, at least one monitoring circuit can be coupled to each of the voltage domains. In another aspect, the monitoring circuit monitors at least a voltage around the one or more switching circuits, a current flowing through the one or more switching circuits, or a time varying voltage around the one or more switching circuits. In another aspect, the timing circuit comprises: a timing driver circuit coupled to the interface; and a linear or circular time to digital converter coupled to the timing driver circuit and the monitoring circuit via the interface. In another aspect, the timing driver circuit comprises: a phase or frequency locked loop; and an encoder coupled to the phase or frequency locked loop. In another aspect, each of the one or more switching circuits contains a decoder or filter circuit. In another aspect, the decoder comprises a second phase or frequency locked loop that locks to the timing signal and uses a control voltage to delay the timing signal by a delayed version of the timing signal, typically one half period. In another aspect, the phase or frequency locked loop comprises an input, a phase frequency divider coupled to the input, a charge pump coupled to the phase frequency divider, a loop filter coupled to the charge pump, an oscillator coupled to the loop filter, an output coupled to the oscillator, and a frequency divider coupled between the output and the input; the encoder comprises a buffer coupled to the output of the phase or frequency locked loop, a delay and logic circuit coupled to the buffer, and a comparator coupled to an output of the loop filter, an output of the time to digital converter, and the delay and logic circuit. In another aspect, the time to digital converter comprises a set of delay elements connected in cascade that produce a thermometer coded output that represents the actual delay.

In another embodiment, the present invention provides a method for operating a power converter with precision control. The method includes initializing a feedback loop of a phase locked loop or a frequency locked loop in terms of a pulse width on a high side and a low side of the power converter, setting a desired dead time, locking a timing control of the phased locked loop or the frequency locked loop until the timing control reaches a steady state, transmitting one or more high side pulses and low side pulses, measuring a dead time using one or more monitored variables, and adjusting a delay in the timing control to reduce a difference between the measured dead time and the desired dead time to approximately zero whenever the measured dead time is greater than the desired dead time.

In another embodiment, the present invention provides a method for controlling a delay within a power converter. The method includes generating one or more timing signals; transmitting the one or more timing signals across an interface of the power converter; generating one or more pulses based on the one or more timing signals using one or more switching circuits; measuring the delay between at least one of the one or more timing signals and at least one of the one or more pulses; generating an output signal based on the delay; and adjusting the delay obtained by monitoring the output signal.

In one aspect, the method does not adjust the timing signal until a timing control circuit reaches a steady state. In another aspect, the method varies a frequency of the timing signal over time. In another aspect, the pulses are complementary, identical, or non-overlapping. In another aspect, the method maintains a slew rate of the pulses approximately equal to a desired slew rate. In another aspect, the output signal comprises the actual dead time, an error between the actual dead time and the desired dead time, a signal or a digital code proportional to the actual dead time, or the difference between the actual dead time and the desired dead time. In another aspect, the method encodes a duty cycle, or a desired slew rate into the timing signal. In another aspect, the method sets or adjusts the desired dead time, the duty cycle, or the desired slew rate. In another aspect, the method modulates the timing signal to have a duty cycle. In another aspect, the method controls a driver circuit using the pulse. In another aspect, power is provided to a load using the driver circuit. In another aspect, the method monitors at least a voltage around the one or more switching circuits, a current flowing through the one or more switching circuits, or a time varying voltage around the one or more switching circuits. In another aspect, the method is implemented using the power converter described above.

In another embodiment, the present invention provides a method for controlling a dead time between a high side pulse and a low side pulse of a power converter. The method includes generating a high side timing signal and a low side timing signal; encoding the high side timing signal and the low side timing signal with a desired dead time between the high side pulse and the low side pulse; transmitting the encoded high side timing signal across an isolation barrier of the power converter; decoding the encoded high side timing signal and the encoded low side timing signal; generating the high side pulse based on the decoded high side timing signal; generating the low side pulse based on the decoded low side timing signal; measuring an actual dead time between the high side pulse and the low side pulse; generating an output signal based on a difference between the actual dead time and the desired dead time; and maintaining a dead time between the high side pulse and the low side pulse that is approximately equal to the desired dead time by adjusting the high side timing signal and the low side timing signal obtained by monitoring the output signal.

In one aspect, the method does not adjust the high side timing signal and the low side timing signal until a timing control circuit reaches a steady state. In another aspect, the method varies a frequency of the high side timing signal and the low side timing signal over time. In another aspect, the high side pulse and the low side pulse are complementary, identical, or non-overlapping. In another aspect, the method maintains a slew rate of the high side pulse and the low side pulse approximately equal to a desired slew rate. In another aspect, the output signal comprises the actual dead time, an error between the actual dead time and the desired dead time, or a signal or a digital code proportional to the actual dead time or the difference between the actual dead time and the desired dead time. In another aspect, the method encodes a duty cycle, or a desired slew rate into the high side timing signal and the low side timing cycle. In another aspect, the method sets or adjusts the desired dead time, the duty cycle, or the desired slew rate. In another aspect, the method modulates the high side timing signal and the low side timing signal to have a duty cycle. In another aspect, the method controls a high side driver circuit using the high side pulse. In another aspect, the method controls a low side driver circuit using the low side pulse. In another aspect, the method monitors at least a voltage around a high side switching circuit and a low side switching circuit, a current flowing through the high side switching circuit and the low side switching circuit, or a time varying voltage around the high side switching circuit and the low side switching circuit. In another aspect, the method is implemented using the power converter described above.

BRIEF DESCRIPTION OF THE DRAWINGS

For a more complete understanding of the features and advantages of the present invention, reference is now made to the detailed description of the invention along with the accompanying figures, in which:

FIG. 5 depicts the forward path timing elements and isolation barrier for high voltage signaling in accordance with one embodiment of the present invention;

FIGS. 6A and 6B depict the decoder implementation using a low pass filter (FIG. 6A), and a retimer using a delay element, PLL/FLL and flip-flop (FIG. 6B) in accordance with one embodiment of the present invention;

DETAILED DESCRIPTION OF THE INVENTION

Figure 1:
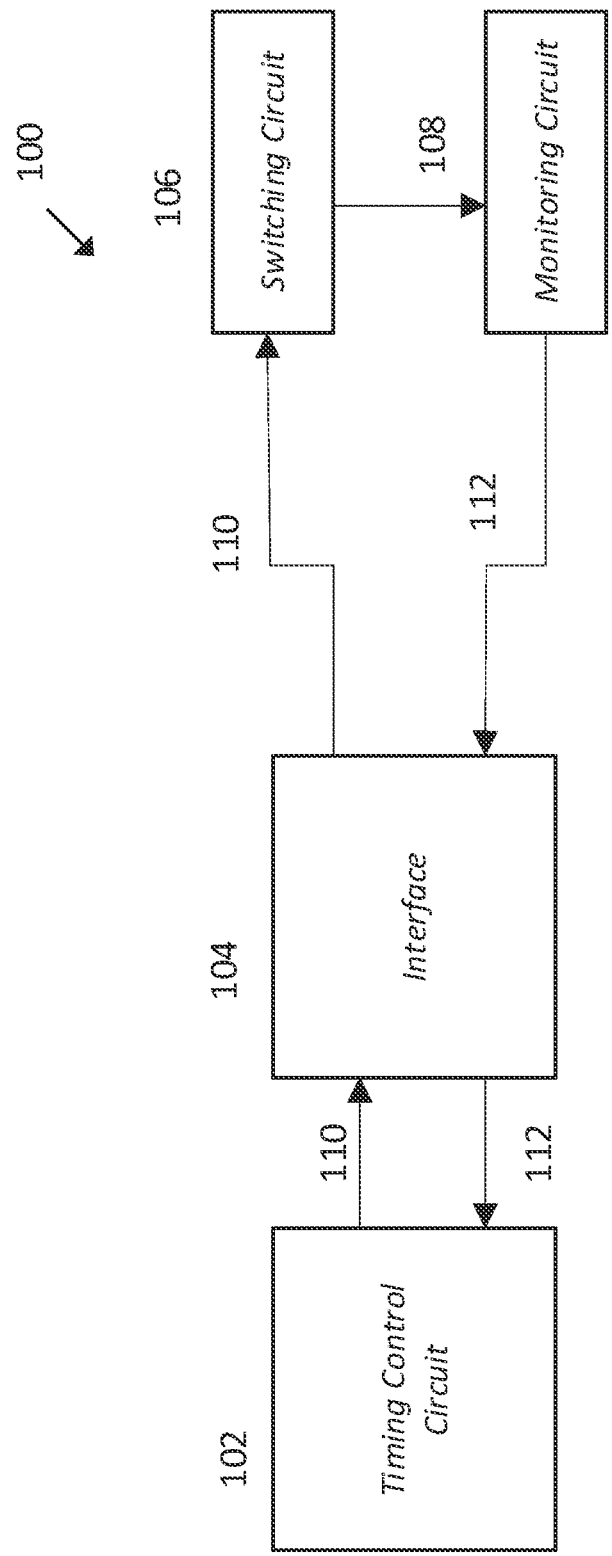
FIG. 1 depicts a block diagram of a power converter in accordance with one embodiment of the present invention.

Illustrative embodiments of the system of the present application are described below. In the interest of clarity, not all features of an actual implementation are described in this specification. It will of course be appreciated that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

A new era of power converters is starting to emerge that capitalizes on the benefits that can be obtained by using wide bandgap power devices like SiC and GaN. This has led to a few challenges that is influencing the technology around these devices: (a) higher switching frequencies, (b) higher operating voltages, and (c) integration needs of converters in the overall systems. The higher switching frequency requires need for lower stray inductors leading to the integration of the drivers with the power devices. As a result, there is a need for on-chip integrated isolation between the drivers and the power deices.

With increasing demand to maximize the efficiency of high voltage power converters, high current gate drivers are often placed between the output of control devices and the gates of the high voltage power transistors. One main challenge for topologies such as the half-bridge/active flyback topologies requires a high side driver. Some key factors that determine the efficiency of these converters are the slew rate and dead time control to protect the power transistors. For high voltage (>500V) applications, this requires high voltage processes that can tolerate the high voltage swings on the switching node (SW).

A power delivery circuit, device or system that operates over at least two different power supplies is described herein. The circuit, device or system includes a monitoring unit and feedback loop to operate the system at a desired dead time. The dead time can be controlled by monitoring signals around the switching or driver elements and providing a mechanism of correction through a feedback loop.

As will be described in more detail below, some embodiments of the power converter use a clock signal from a controller as a reference clock to a multiplying phase-locked loop circuit (PLL) that generates a high frequency clock that can be transmitted across a capacitive isolation barrier. This clock signal is further modulated to have a high/low duty cycle based on the input signal—as a result the duty cycle information is encoded as the duty cycle of the PLL output clock. On the decode side, the high frequency signal is received by another PLL that locks to the input and uses the control voltage from the VCO to delay the incoming clock by ½ a period of the modulating clock. This signal is then used to re-time the incoming clock to regenerate the exact replica of the control signal into the device. The precision of the output is determined by the multiplication factor of the PLL and is independent of process voltage or temperature since the PLL frequency is simply determined by the reference clock from the controller. Other detection methods may include: (1) a RC filter followed by multiple skewed inverters that are OR'd, or (2) a waveform delay followed by multiple delay elements with their outputs OR'd.

In other embodiment, an oscillator or frequency locked loop circuit (FLL) (using delay elements for the oscillator) generates a fixed frequency that is similarly encoded using the controller output. The receiver uses an identical delay line that generates a ½ period delay and uses that to retime the input and reproduce the original signal. These embodiments have some dependence on the process/voltage/temperature, but the impact will be limited especially if the oscillator runs at much higher frequency compared to the input. Another embodiment uses a low pass filter to recover the original signal, but this may have more susceptibility to process/voltage/temperature variations.

In addition, the addition of a feedback path from the high side to the controller digitally tunes both the dead time and slew rate of the gate drivers.

Moreover, spread-spectrum modulation of the PLL output can be used to reduce EMI and as a result reduce the BOM cost for EMI filters in the system.

Additional features and benefits of the power converter may include, but are not limited to:

(1) Isolation is used, which offers lower series reactance as switching frequency increases. An adjustable frequency can be used in the switching of the drivers. These frequencies are typically in the range of 100 kHz to 1 MHz. Due to the high voltage usage in the system, there is significant amount of electromagnetic radiation. To mitigate this, the switching frequency can be made to vary over time following an algorithm. This algorithm can be configured by software.

(2) Capacitive isolation consumes very minimum area and does not provide EM xtalk. This is beneficial for form factor, cost and performance of the overall system.

(3) Capacitive isolation offers wideband frequency response. Isolation using inductive coupling and resonance does not scale with respect to technology nodes and provides only a narrowband frequency response. The center frequency of the clock used in the system can be dynamically adjusted and a spread spectrum scheme can be easily implemented, which is also applicable to other isolation schemes.

(4) Construction can use fully differential implementation which is immune to the supply and ground bounces.

(5) Timing control is implemented digitally and can be adjusted on demand.

(6) The pulse width and the edge delay between the high side driving waveforms are determined by a control voltage. The same control voltage is provided to the receiving side for demodulation. Since the receiving delay elements in the feedback path are the same as the forward path elements, both the delays track each other and a robust detection is guaranteed.

Various non-limiting embodiments will not be described in more detail.

FIG. 1 depicts a block diagram of a power converter 100 in accordance with one embodiment of the present invention. The power converter 100 includes a timing control circuit 102, an interface 104 coupled to the timing control circuit 102, one or more switching circuits 106 coupled to the interface 104, and a monitoring circuit 108 coupled to the one or more switching circuits 106 and the timing control circuit 102. The monitoring circuit 108 can be directly coupled to the timing control circuit 102 or indirectly coupled to the timing control circuit 102 via the interface 104 as shown. The timing control circuit 102 provides precise timing by generating and sending one or more timing signals 110 to the one or more switching circuits 106 via the interface 104. In some embodiments, a timing signal 110 may be sent directly to one of the switching circuit 106 (e.g., a low voltage switching circuit, etc.). The one or more timing signals 110 can vary in terms of amplitude, voltage levels, frequency, phase and duty cycle as required by the application in which the power converter 100 is used. The one or more switching circuits 106 generate one or more pulses in response to the one or more timing signals 110 to supply power to a load either directly or via a driver circuit. The monitoring circuit 108 operates as a sensing element that measures a delay between at least one of the one or more timing signals 110 and at least one of the one or more pulses. For example, the monitoring circuit 108 can measure specific trigger points in terms of electrical characteristics (voltage amplitude, current, phase, frequency, voltage levels) or thermal characteristics (electrical output from a temperature sensor device). Moreover, multiple monitoring circuits 108 may be used to monitor characteristics of timing control and may operate concurrently or sequentially. The monitoring circuit 108 generates and provides an output signal 112 based on the delay to the timing control circuit 102 to adjust the characteristics of the timing control circuit 102 to maximize efficiency of the overall switching circuit and maintain capabilities of the precise timing. The timing circuit 102 adjusts the delay obtained by monitoring the output signal 112. Input to the timing control circuit 102 can be provided by a state machine, microcontroller, or power on reset sequencer. The timing control and feedback loop may be bypassed using a digital control. Moreover, the precise control of the power converter 100 can be continuous, near continuous, or activated periodically as needed by the application in which the power converter is used.

In one aspect, the monitoring circuit is coupled to the timing control circuit via the interface. In another aspect, the one or more pulses vary in amplitude, voltage level, frequency, phase, or duty cycle. In another aspect, the monitoring circuit measures the delay by measuring one or more electrical or thermal characteristics. In another aspect, the one or more electrical characteristics comprise voltage amplitude, current, phase, frequency or voltage levels; and the one or more thermal characteristics comprise an electrical output from a temperature sensor. In another aspect, the monitoring circuit comprises two or more monitoring circuits that operate concurrently or sequentially. In another aspect, the one or more timing signals comprise a high side timing signal and a low side timing signal; the one or more switching circuits comprise a high side switching circuit that generates a high side pulse in response to the high side timing signal, and a low side switching circuit that generates a low side pulse in response to the low side timing signal; the delay comprises one or more delays between the high side pulse and the low side pulse, the high side pulse and the high side timing signal, or the low side pulse and the low side timing signal; and the output signal comprises one or more output signals based on the one or more delays. In another aspect, the high side pulse and the low side pulses are complementary, identical, or non-overlapping. In another aspect, the high side switching circuit and the low side switching circuit use differential circuitry. In another aspect, the timing control circuit does not adjust the timing signal until the timing control circuit reaches a steady state. In another aspect, a frequency of the one or more timing signals vary over time. In another aspect, the timing control circuit maintains a slew rate of the one or more pulses approximately equal to a desired slew rate. In another aspect, the output signal from the monitoring circuit comprises an actual dead time, an error between the actual dead time and a desired dead time, a signal or a digital code proportional to the actual dead time or a difference between the actual dead time and the desired dead time. In another aspect, the timing control circuit encodes a desired dead time, a duty cycle, or a desired slew rate into the one or more timing signals. In another aspect, the desired dead time, the duty cycle, or the desired slew rate are adjustable on demand via a controller. In another aspect, the interface comprises an isolation barrier. In another aspect, the isolation barrier comprises a capacitor circuit, an inductor circuit or a radio-frequency based transmission circuit. In another aspect, the isolation barrier comprises: a first isolation circuit coupled between the timing control circuit and the one or more switching circuits; and a second isolation circuit coupled between the monitoring circuit and the timing control circuit. In another aspect, each of the one or more switching circuits comprises a pre-driver circuit coupled to a switch. In another aspect, a load is coupled to at least one of the one or more switching circuits. In another aspect, the monitoring circuit comprises a voltage level comparator, a current level comparator, a temperature sensor, or a capacitor divider. In another aspect, the monitoring circuit monitors at least a voltage around the one or more switching circuits, a current flowing through the one or more switching circuits, or a time varying voltage around the one or more switching circuits. In another aspect, the timing circuit comprises: a timing driver circuit coupled to the interface; and a linear or circular time to digital converter coupled to the timing driver circuit and the monitoring circuit via the interface. In another aspect, the timing driver circuit comprises: a phase or frequency locked loop; and an encoder coupled to the phase or frequency locked loop. In another aspect, each of the one or more switching circuits contains a decoder or filter circuit. In another aspect, the decoder comprises a second phase or frequency locked loop that locks to the timing signal and uses a control voltage to delay the timing signal by one half period. In another aspect, the phase or frequency locked loop comprises an input, a phase frequency divider coupled to the input, a charge pump coupled to the phase frequency divider, a loop filter coupled to the charge pump, an oscillator coupled to the loop filter, an output coupled to the oscillator, and a frequency divider coupled between the output and the input; the encoder comprises a buffer coupled to the output of the phase or frequency locked loop, a delay and logic circuit coupled to the buffer, and a comparator coupled to an output of the loop filter, an output of the time to digital converter, and the delay and logic circuit. In another aspect, the time to digital converter comprises a set of delay elements connected in cascade that produce a thermometer coded output that represents the actual delay.

Figure 2:
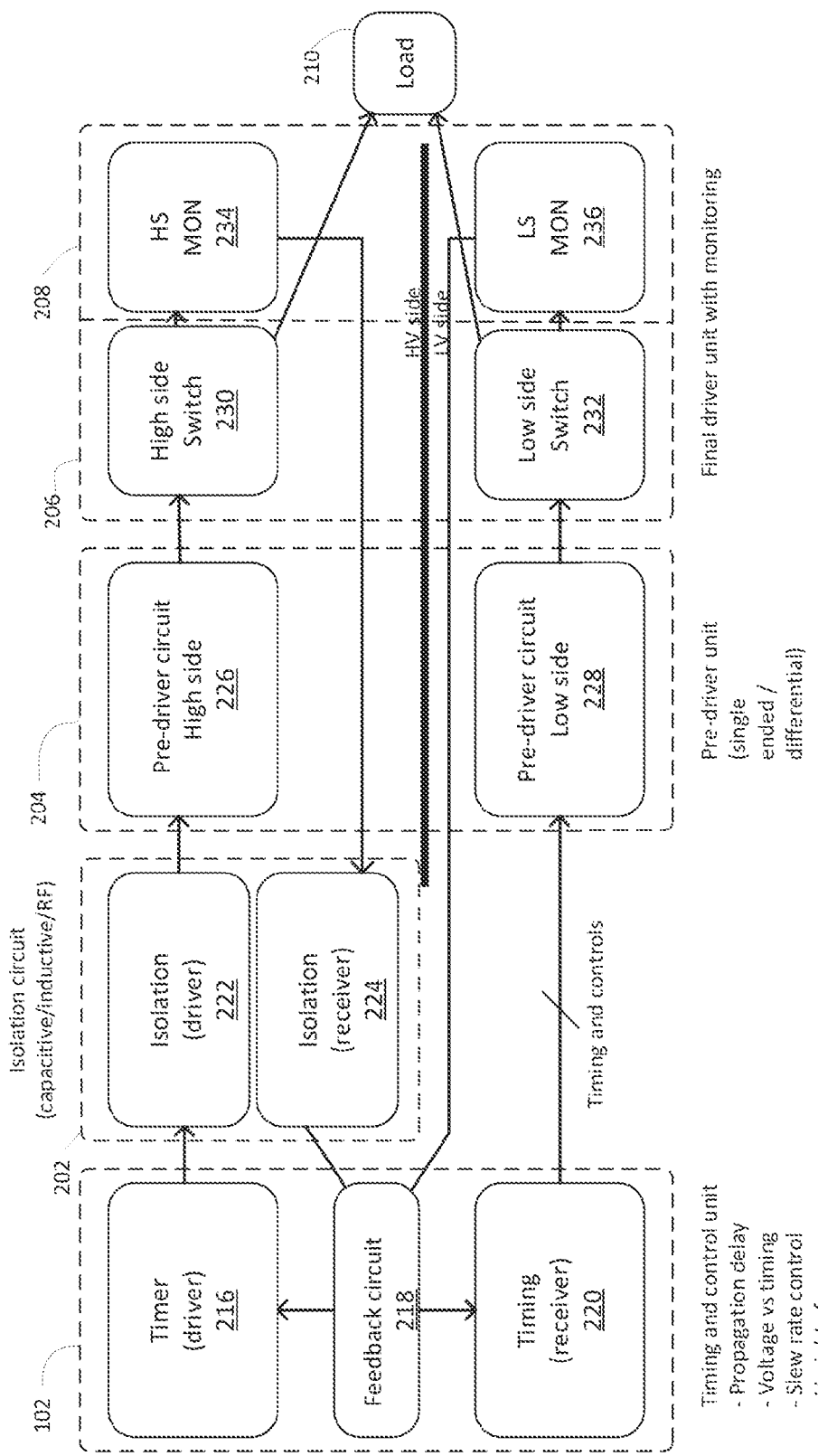
FIG. 2 depicts a block diagram of a power converter in accordance with one embodiment of the present invention.

FIG. 2 depicts a block diagram of a power converter 200 in accordance with another embodiment of the present invention. The power converter includes a timing control circuit 102, an isolation circuit 202 coupled to the timing control circuit 102, a switching circuit 204 (also referred to as a pre-driver circuit) coupled to the isolation circuit 202, a switch 206 (also referred to as a driver circuit) coupled to the switching circuit 204, a monitoring circuit 208 coupled to the switch 206 and the timing control circuit 102, and a load 210 coupled to switch 206. Note that the switching circuit 204, switch 206 and monitoring circuit 208 each include a high voltage side 212 and a low voltage side 214. The timing control circuit 102 includes a first timing circuit (driver) 216, a feedback circuit 218 coupled to the first timing circuit 216, and a second timing circuit (receiver) 220 coupled to the feedback circuit 218. The isolation circuit 202 includes a first isolation circuit (driver) 222 coupled to the first timing circuit 216, and a second isolation circuit (receiver) 224 coupled to the feedback circuit 218. The switching circuit 204 includes a high side switching circuit 226 coupled to the first isolation circuit 222 and a low side switching circuit 228 coupled to the second timing circuit 220. The switch 206 includes a high side switch 230 coupled to the high side switching circuit 226 and to the load 210, and a low side switch 232 coupled to the low side switching circuit 228 and the load 210. The monitoring circuit 208 includes a high side monitoring circuit 234 coupled to the high side switch 230 and the second isolation circuit 224, and a low side monitoring circuit 236 coupled to the low side switch 232 and the feedback circuit 218.

The power converter 200 controls timing in two voltage domains that are substantially different from each other (i.e., high voltage side 212 and low voltage side 214). For example, the low voltage could be 1.8 to 5V while the high voltage could be 20 to 600V. The timing control circuit 102 is responsible for generating a: (a) desired frequency used for the switching converters, (b) desired pulsewidth for the output voltage, and/or (c) desired slew rate. The first timing circuit 216 provides separate pulses that control the high side pre-driver circuit 226 and the second timing circuit 218 provides separate pulses that control the low side pre-driver circuit 228, and the delay between them can be programmed to a desired delay value. The first timing circuit 216 provides high frequency signals that are provided to high side pre-driver circuit 226 through a first isolation circuit 222. This isolation circuit 222 may be implemented using a capacitor, inductor and other RF based transmission. After the signal is transmitted to the high side pre-driver circuit 226 via the first isolation circuit 222, the high side pre-driver circuit 226 is used to drive the final driver circuit 230. The high side pre-driver circuit 226 can be sized to provide a desired drive strength. Furthermore, the high side monitoring circuit 234 coupled to the high side driver circuit 230 and the low side monitoring circuit 236 coupled to the low side driver circuit 232 provide information about the dead time adjustment via the feedback circuit 218. The monitoring circuits 234 and 236 could be a signal from temperature sensor, voltage level comparator, current comparator and the likes. Both the high voltage side 212 and low voltage side 214 use differential circuitry and the exact same hardware so that the delays are the same in both cases. This helps common mode rejection in the high voltage side 212, and maintain the same timing distortions in both paths so that the delay between them is substantially constant.

The power converter 200 can be used in a duty cycle fashion to reduce the power consumption further. The timing control circuit 102 can comprise of core timing elements that include phase locked loop (PLL) or a frequency locked loop (FLL). The core clocking element uses a plurality of delay cells connected in positive feedback and provides a control voltage that contain information about the timing. This control voltage can be used in other blocks to use the timing information that tracks the core clocking element over process and temperature variations, for providing feedback and dead time control. It also shows an H-bridge application but can be used for other drivers such as totempole drive, motor drive and any other types of isolated drive. The high voltage devices can be fabricated in Gallium Nitride (GaN) technology, Silicon Carbide (SiC) and high voltage bipolar and CMOS processes.

Prior art devices use open loop on-off keying (OOK) technique to transfer information across the isolated barrier. The solutions proposed in the prior art do not use precise timing control for feedback. As a result and unlike the present invention, the prior art devices do not provide precise control of the dead-time and higher efficiency of the overall system.

Figure 3:
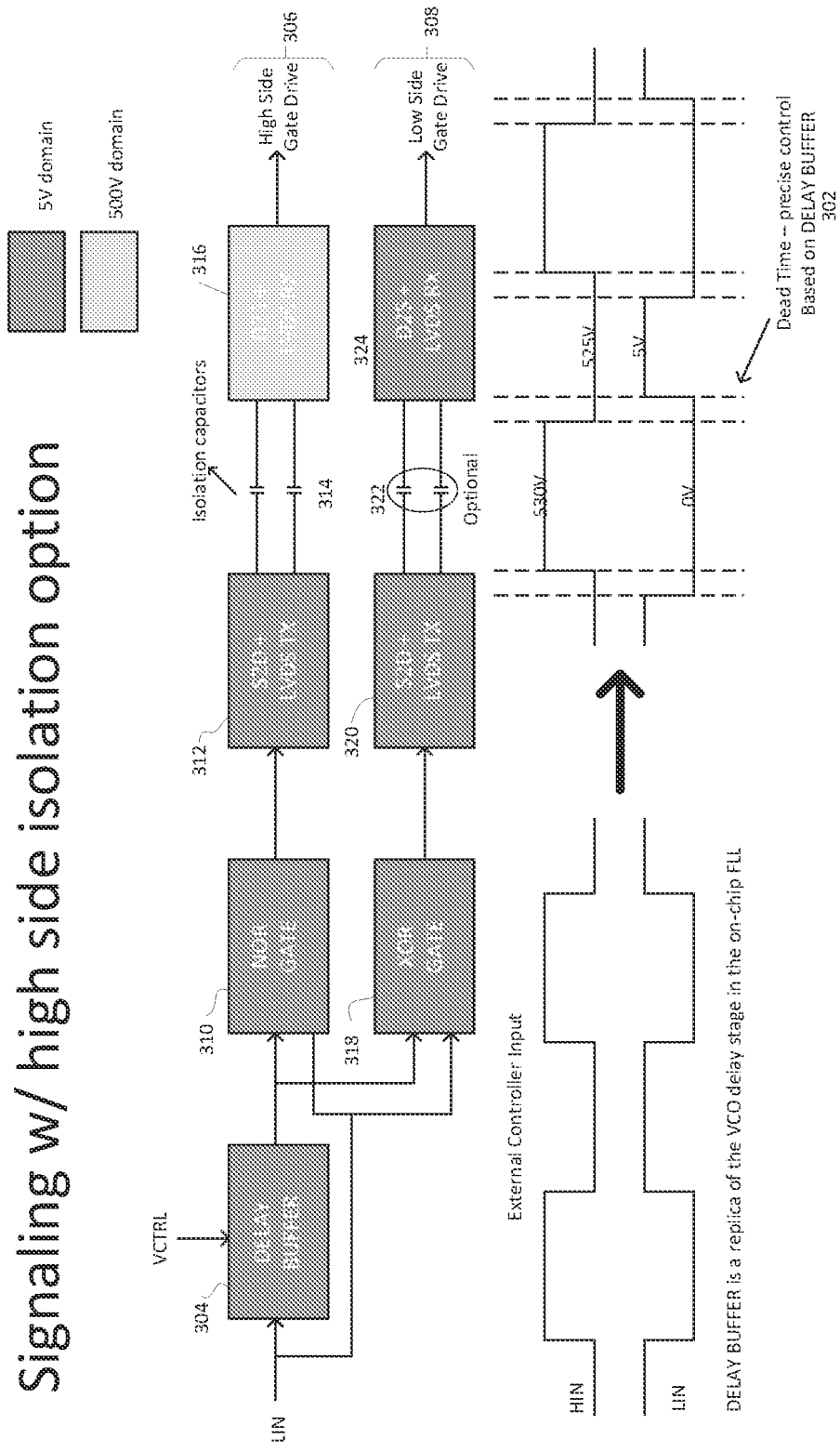
FIGS. 3A-3C provide some exemplary details of the timing control in accordance with one embodiment of the present invention.

FIGS. 3A-3C provides some exemplary details of the timing control in accordance with one embodiment of the present invention. In this case and as shown in FIG. 3A, the HIN and LIN signals are complementary in nature and can be generated on-chip or can be provided externally. In other embodiments, the HIN and LIN signals can be identical or non-overlapping. FIG. 3B shows the high and low output voltages with the dead time 302. Various logic gates can be used to provide the desired pulses that are needed for the drivers as shown in FIG. 3C. The delay buffer 304 is connected to a high side circuit 306 and a low side circuit 308. The high side circuit 306 includes series connected NOR Gate 310, single to differential converter (S2D)+low-voltage differential signaling (LVDS) transmitter 312, isolation circuit 314, and differential to signal converter (D2S)+low-voltage differential signaling (LVDS) receiver 316. The low side circuit 308 includes series connected XOR Gate 318, S2D)+LVDS transmitter 320, isolation circuit 322 (optional), and D2S+LVDS receiver 324. In this example, the dark colored elements are in the 5V domain, and the light colored elements are in the 500V domain.

Figure 4:
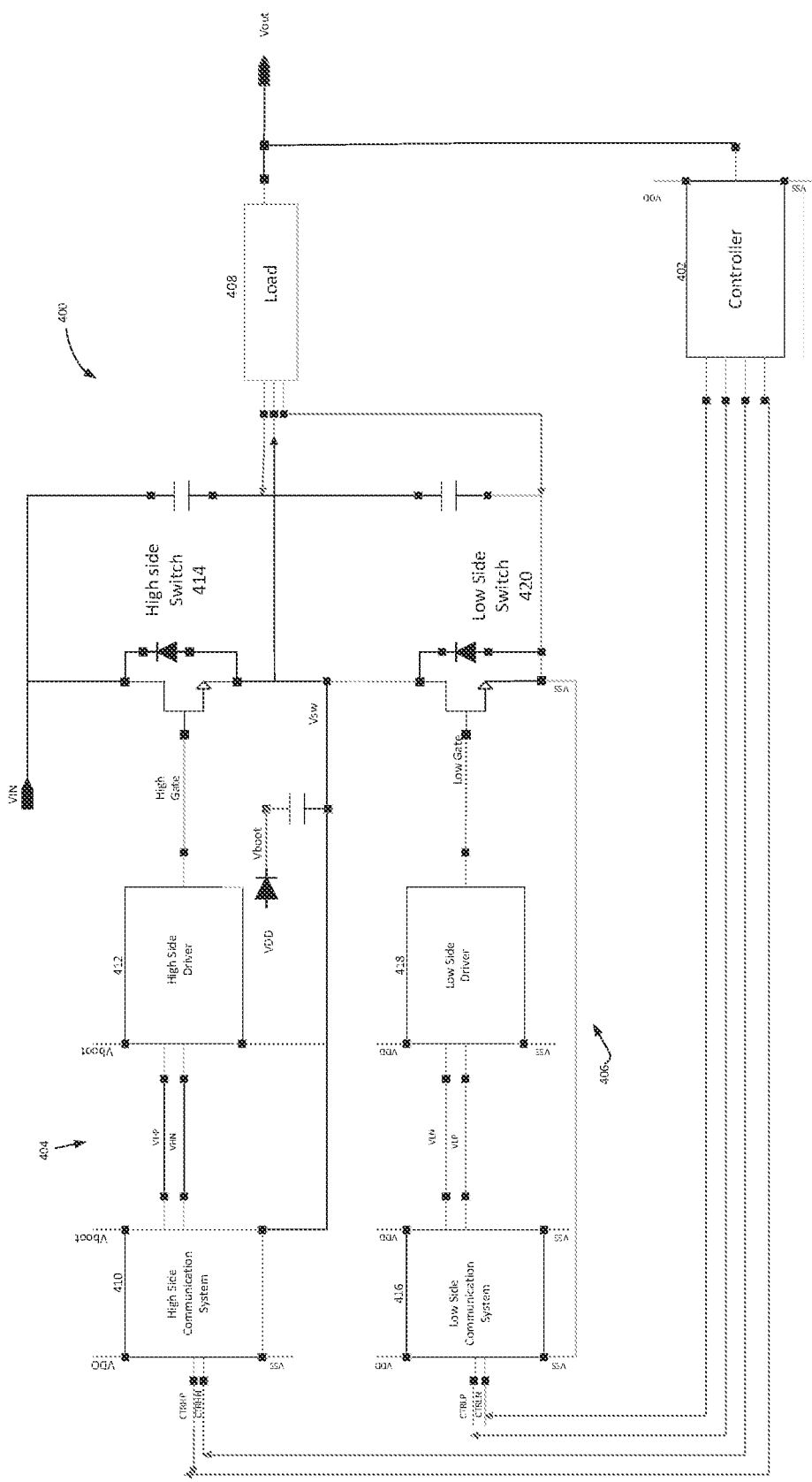
FIG. 4 depicts a system level setup showing the constituent blocks in accordance with one embodiment of the present invention.

FIG. 4 depicts a system level setup 400 showing the constituent blocks in accordance with one embodiment of the present invention. The power converter uses the feedback signals directly fed to the PLL reference to control the dead time. The switching frequency of the driver could be somewhere around 100 kHz-1 MHz for the specific application but could be other values for other applications as well. For the example system, a value of high frequency of 250 MHz has been used. The controller 402 is connected to a high side path 404 and a low side path 406, which in turn are connected to a load 408. The high side path 404 include a high side communication system 410, a high side driver 412 and a high side switch 414. The low side path 406 includes a low side communication system 416, a low side driver 418 and a low side switch 420. The controller, driver and the switching elements can be implemented in different technologies or in the same technology with high voltage capability. The load could be an H-bridge application but can be used for other drivers such as totempole drive, motor drive and any other types of isolated drive.

FIG. 5 depicts the forward path timing elements and isolation barrier for high voltage signaling in accordance with one embodiment of the present invention. The high voltage signaling path include a PLL or FLL transmitter 502, transmit decoder 504, differential transmitter 506, isolation capacitors 508, differential receiver 510, receive decoder 512 and gate driver 514.

FIGS. 6A and 6B depict the decoder implementation using a low pass filter 602 (FIG. 6A), and a retimer using a delay element, PLL/FLL and flip-flop 604 (FIG. 6B) in accordance with one embodiment of the present invention. The PLL provides output signals that are provided to an encoder and differentially provided to the isolation barrier. Differential topology helps maintain signal integrity in the presence of common mode transient events. Differential to single ended conversion can be performed by simply using one side of the differential driver to the final driver and the other side left unconnected or terminated with a dummy load to maintain symmetry.

Figure 7:
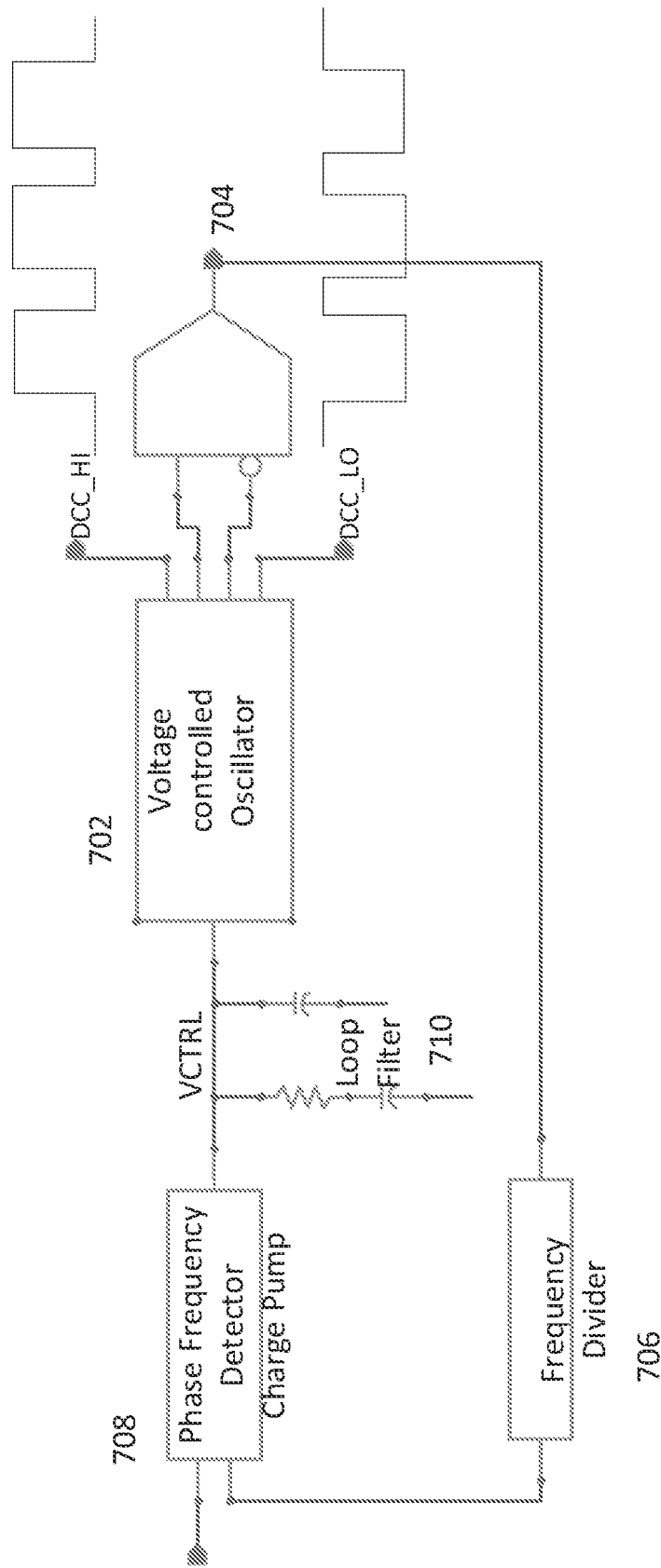
FIG. 7 depicts the functional blocks used in the PLL wherein the input frequency IN is multiplied up based on the frequency divider setting in accordance with one embodiment of the present invention.
Figure 8:
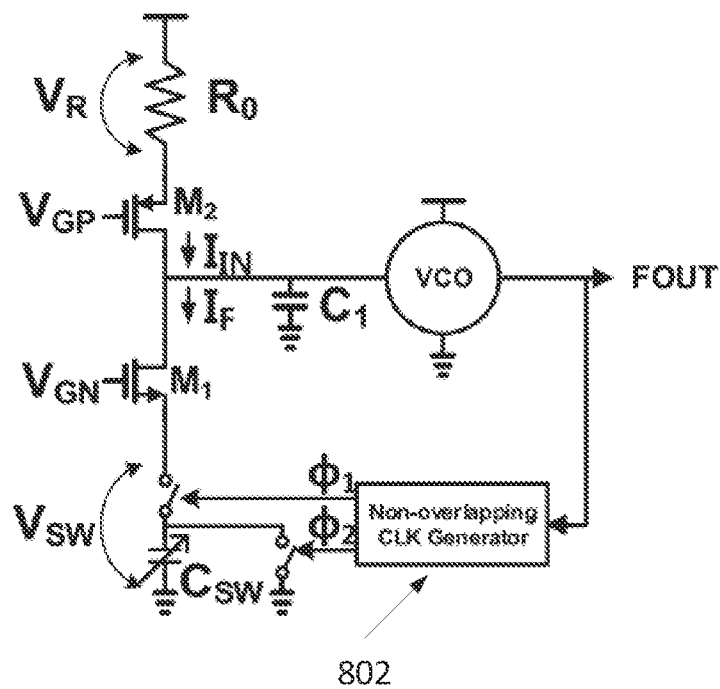
FIG. 8 depicts a diagram for a phase locked loop implementation in accordance with one embodiment of the present invention.

FIG. 7 depicts the functional blocks used in the PLL wherein the input frequency $F_{IN}$ is multiplied up based on the frequency divider setting in accordance with one embodiment of the present invention. To reduce EM x-talk and area, a ring oscillator 702 is used. The oscillator's output 704 is divided using a frequency divider 706 and the oscillator 702 is controlled by a phase frequency divider (PFD), charge pump (CP) (collectively referred to as PFDCP 708) and loop filter (LF) 710. An alternate to the PLL implementation could be a frequency locked loop 800 as shown in FIG. 8. An additional error amplifier may be placed in the FLL loop prior to the VCO to improve accuracy of the output frequency. A well controlled reference frequency in the PLL and a well controlled DC reference (voltage or current) are essential for accurate control of the output frequency of the timing control element. More specifically, FIG. 8 depicts a switched capacitor $C_{SW}$ with non-overlapping clocks 802 to generate the desired output frequency FOUT depending on the reference resistance $R_0$. Yet another alternate is to implement a spread spectrum capability inside either the PLL or FLL to vary the frequencies over time according to a desired algorithm to reduce EMI. The PLL and FLL can be implemented using analog or digital techniques.

Figure 9:
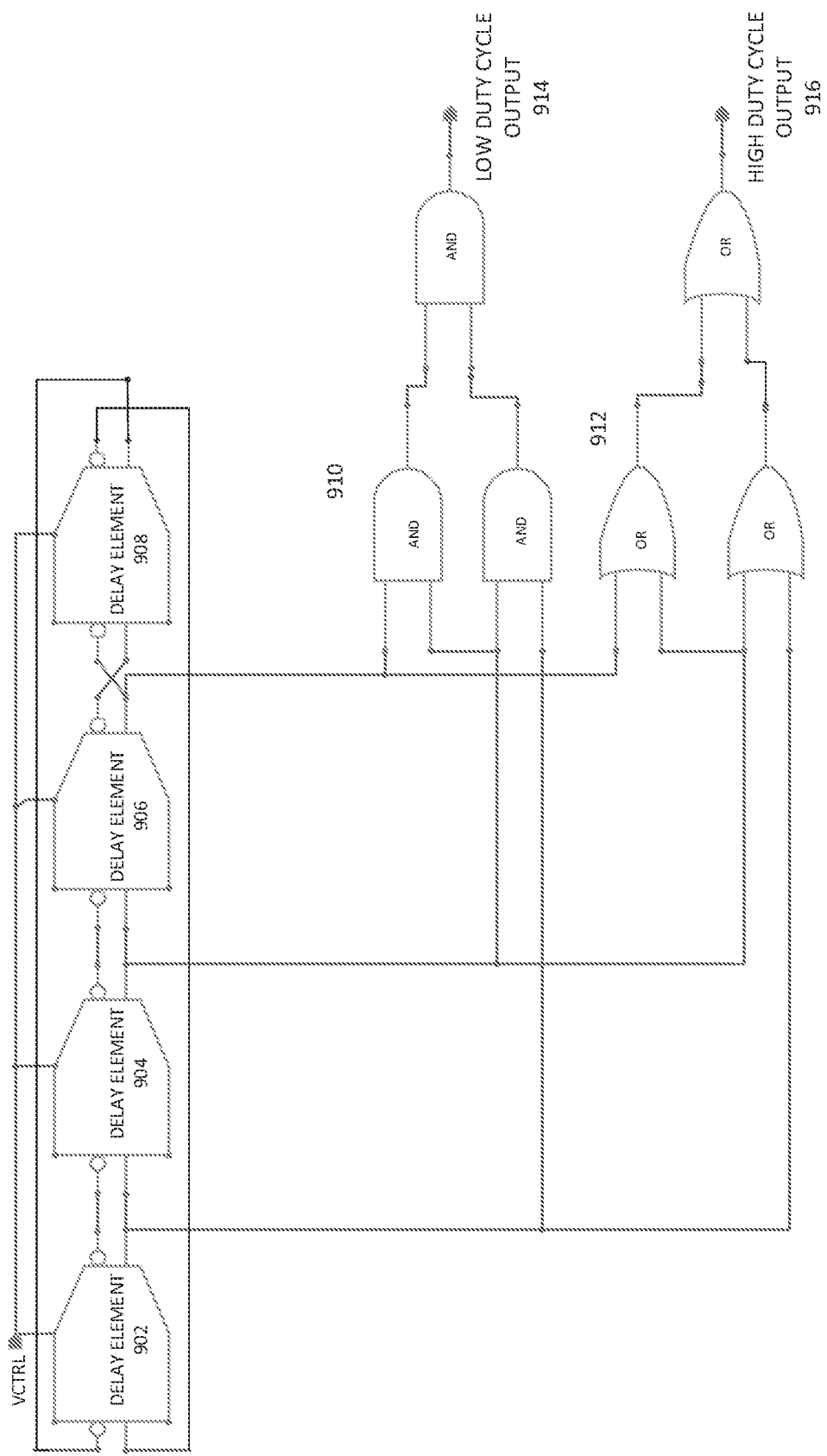
FIG. 9 provides an exemplary implementation of the PLL in accordance with one embodiment of the present invention.

FIG. 9 provides an exemplary implementation of the ring oscillator used in the PLL in accordance with one embodiment of the present invention. The delay cells coupled in a feedback provides an oscillator with a desired frequency. The delay cells may be single ended or differential. For differential signal generation, even number of cells are used. Similarly, an odd number of cells are used for single ended signal generation. The specific differential oscillator implementation uses four stages of delay elements 902, 904, 906 and 908 and a set of combinatorial logic elements 910 and 912 to provide pulses with low duty cycle 914 and high duty cycle 916. The delay of the delay elements 902, 904, 906 and 908 provides the desired resolution that is needed for precise control.

Figure 10:
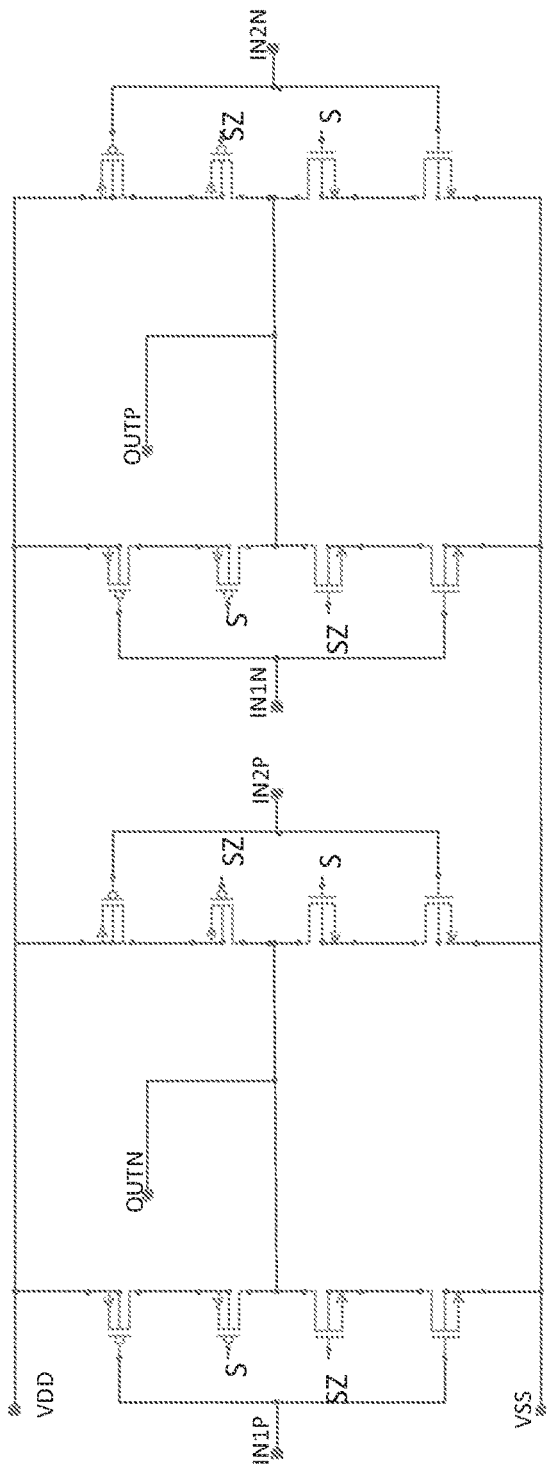
FIG. 10 shows the details of an encoder implementation in accordance with one embodiment of the present invention.

FIG. 10 shows the details of an encoder implementation in accordance with one embodiment of the present invention. The S (SZ) signal is the low frequency input that selects the high and low duty cycle version of the VCO outputs shown in FIG. 7. The high frequency encoded signal is sent across the isolation barrier and is decoded to recover the input. FIGS. 5-6A show one embodiment of the decoder which is a simple filter. Another embodiment is shown in FIG. 6B that provides more precise decoding uses the same PLL as the encoder and uses the control voltage to delay the input signal by ½ UI using the same delay element and then use the signal to sample the incoming encoded signal to recover the data.

Figure 11:
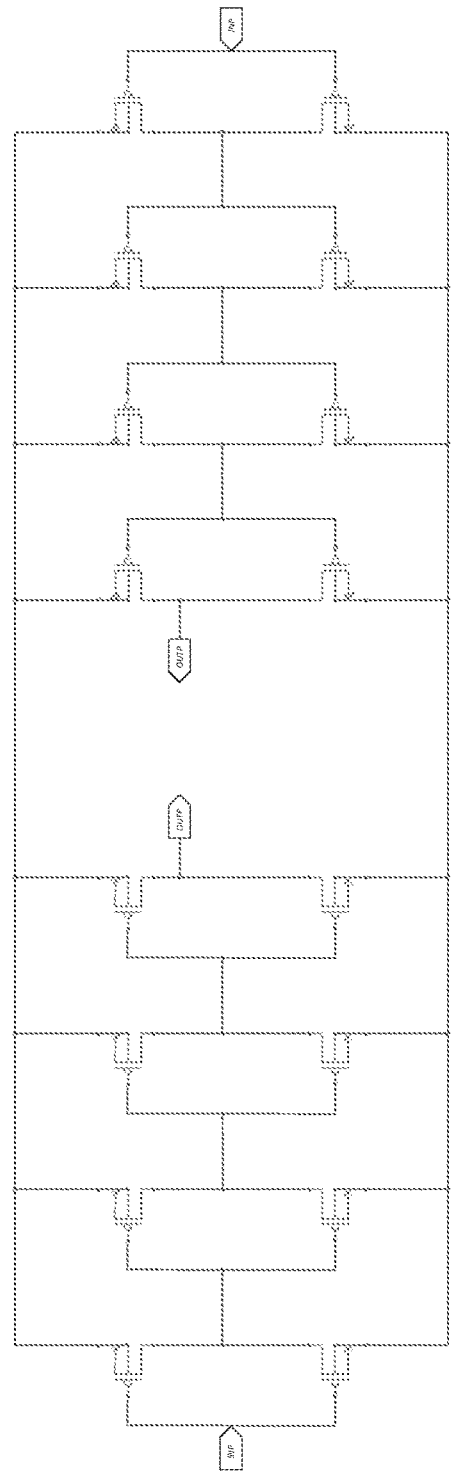
FIGS. 11-12 provide a set of pre-drivers configured to drive the load of the final high voltage driver in accordance with one embodiment of the present invention.
Figure 12:
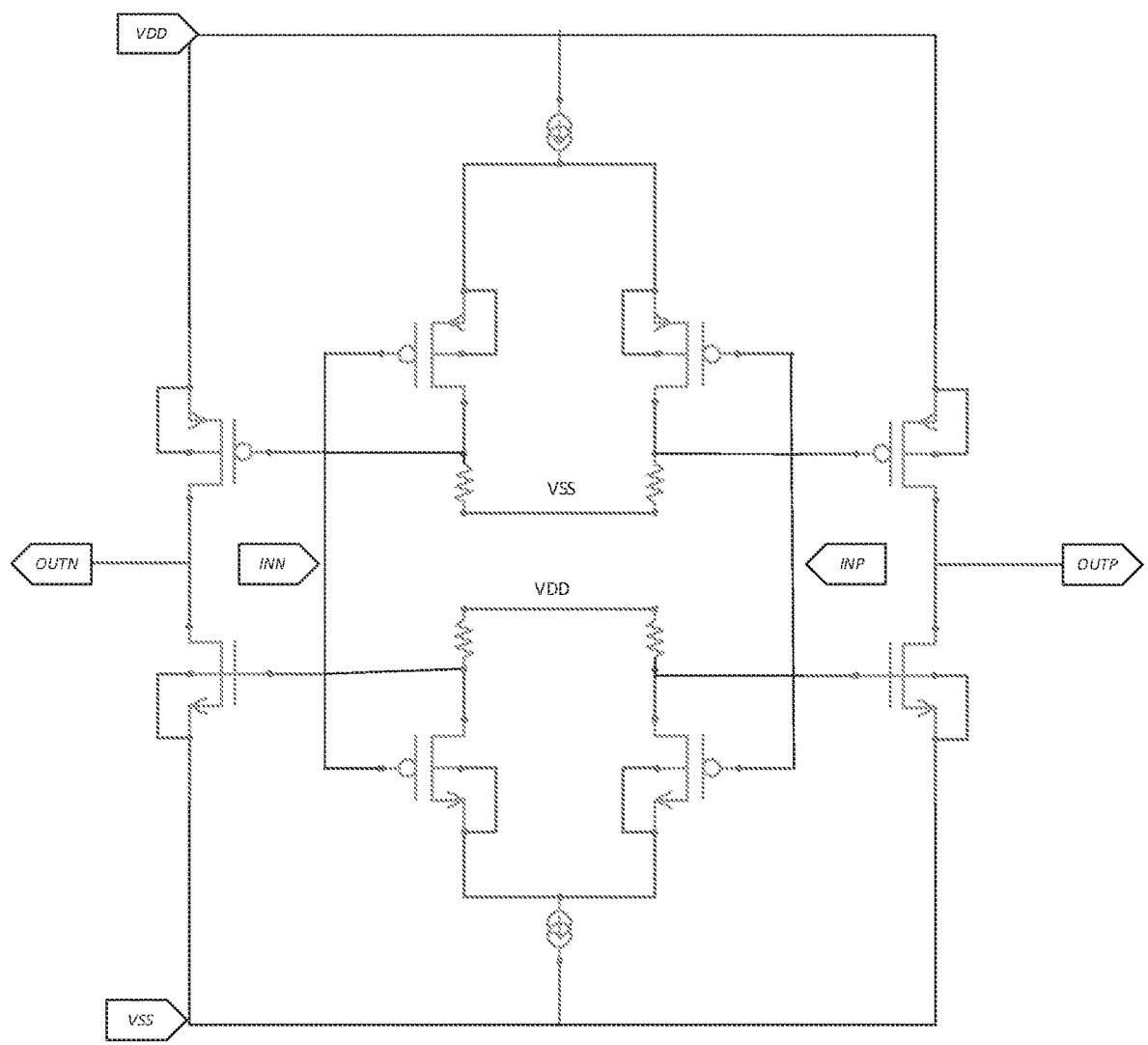

FIGS. 11-12 provide a set of pre-drivers configured to drive the load of the final high voltage driver in accordance with one embodiment of the present invention. FIG. 11 depicts a transmitter/driver for driving a HV transistor. FIG. 12 depicts a low power differential driver using CML/CMOS stages. The driver receives differential signal and provide single ended signal to the HV driver. The differential nature of the drivers reduce common mode disturbance. They can be configured as a combination of current mode and CMOS logic families depending on power consumption, voltage headroom and speed, and can be implemented using other types of transistors such as bipolar, JFETs etc.

In a fully CMOS implementation, both the input and outputs are rail to rail. The current mode logic uses an adequate level of signal to reduce the swing (the output signal is governed by the product of tail current and load resistors) and power consumption which can lead to low EM x-talk and better common mode noise immunity from the supply as it is implemented in current mode. The power consumption is kept very low by switching the final CMOS predriver stage with just adequate amount of swing that is necessary.

Figure 13:
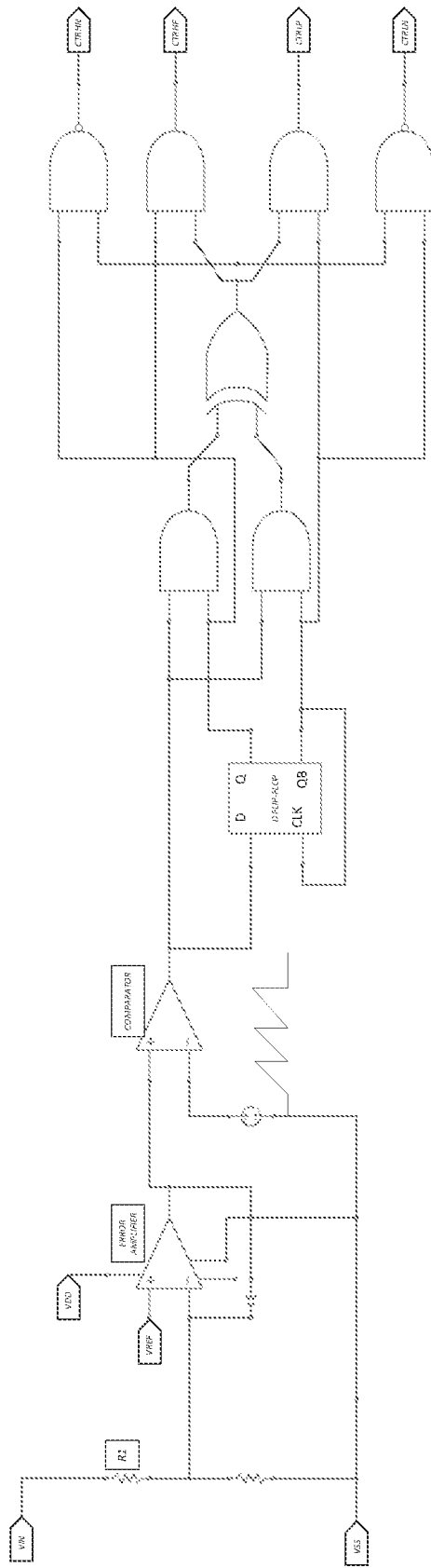
FIG. 13 shows a controller to control dead time in accordance with one embodiment of the present invention.

FIG. 13 shows a controller used to provide pulses with various duty cycles in accordance with one embodiment of the present invention. The controller can be a state machine, a microcontroller, pins can be brought from the i/o, can send timing as well as fault condition, temperature, etc. This is a simple implementation using hard wired logic and alternate implementations are possible.

Figure 14:
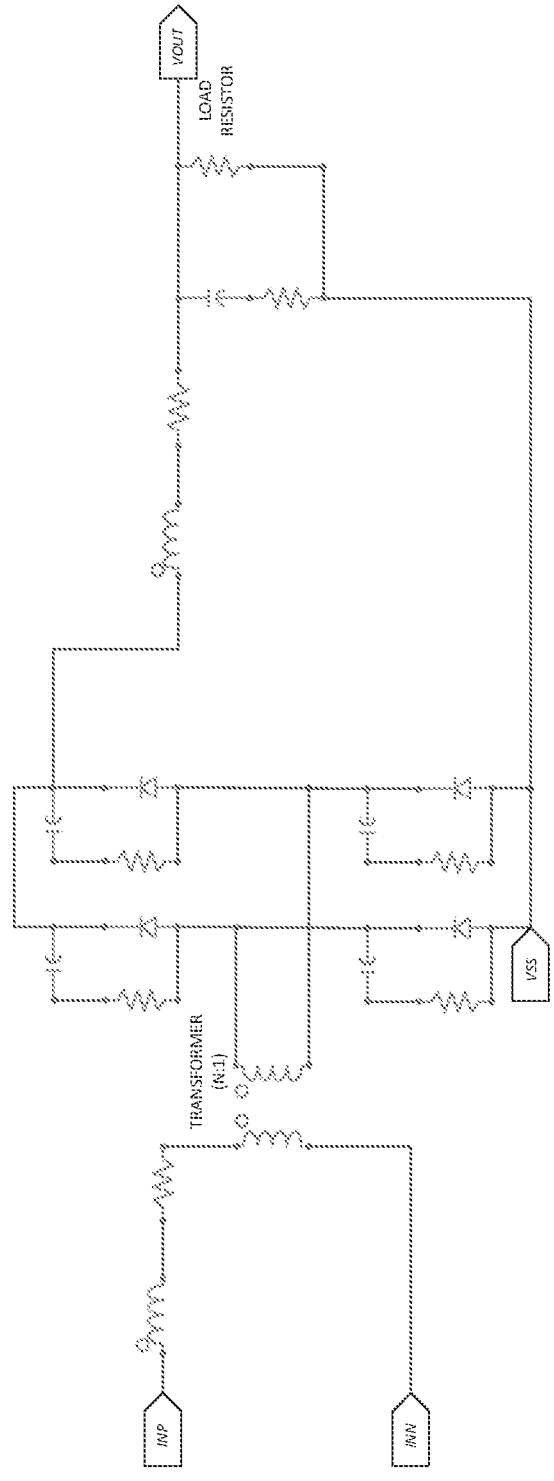
FIG. 14 shows an example of a load network in accordance with one embodiment of the present invention.

FIG. 14 shows an example of a load network in accordance with one embodiment of the present invention. Typically load networks include passive elements to reduce losses. Any other implementations are also possible. The load network can provide an H bridge topology, full wave rectification, motor driver etc.

Figure 15:
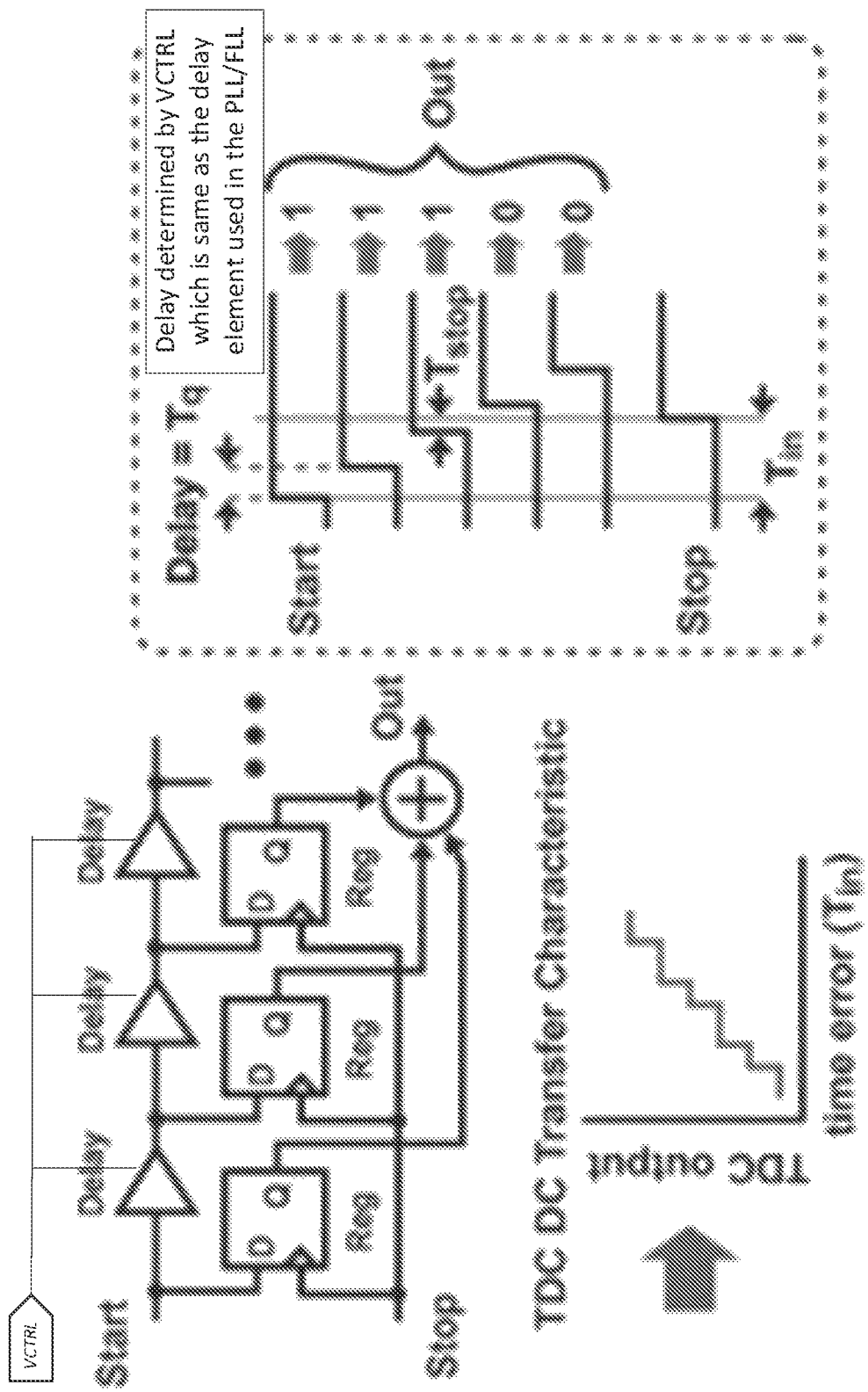
FIG. 15 provides an exemplary system with some details of the elements described already in accordance with one embodiment of the present invention.

FIG. 15 shows a linear time to digital conversion (TDC) in accordance with one embodiment of the present invention. This may also use a circular TDC for both range and resolution to reduce power consumption and area requirements for implementation.

The TDC operates as follows. Two signals are provided to the TDC block. The first signal propagates through a number of delay elements connected in cascade. Each of the delay cells are identical and accepts an analog control voltage from the master oscillator used in the timing control element. Output from each of the delay cell is provided to a D-type flip flop (DFF) at the data terminal, while the second input to the TDC block is used as a clock signal to each of the DFFs. As a result, for a TDC with N stages, M of them will provide an output of logic HI (1), while the (N-M) stages will provide an output of logic LO (0). The final output from the TDC is thus a thermometer coded output of the delay between the two waveforms provided to the TDC. This thermometer code represents the amount of dead time in units of delay obtained from the core oscillator.

Figure 16:
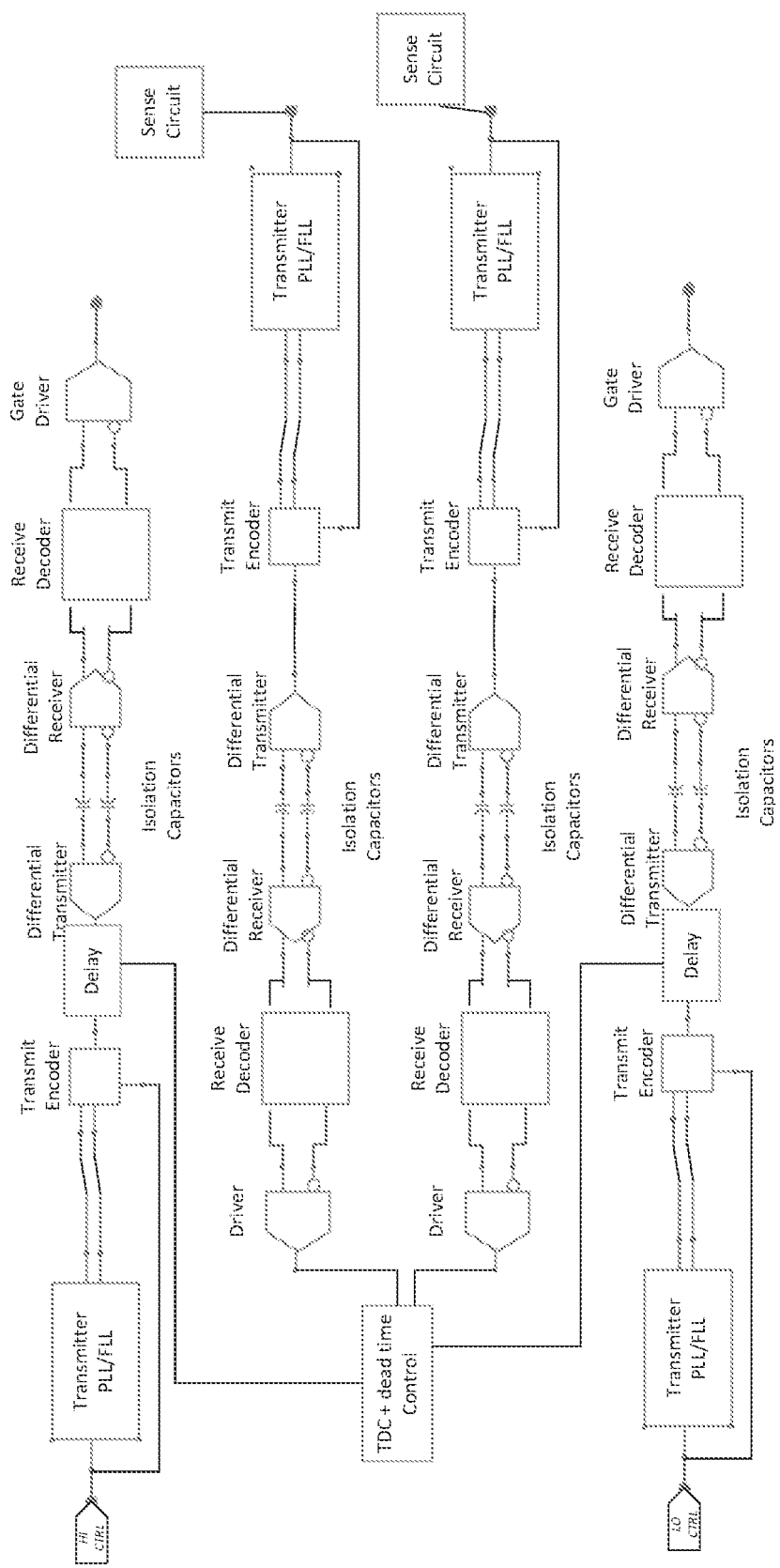
FIG. 16 shows a linear time to digital conversion in accordance with one embodiment of the present invention.

FIG. 16 provides an exemplary system with some details of the elements described already in accordance with one embodiment of the present invention. A key component includes the monitoring element, which can monitor the delay between the two pulses in high side and low side and convert it to a digital word. The monitoring unit can be a voltage monitor, current monitor, a temperature sensor. It can use voltage, current or a combination of the two. The monitored signal is transmitted across the barrier to the controlling side to indicate the monitored variable. The entire system is initially put in a RESET state which initializes the feedback loop.

The implementation of the entire power converter can be done in one process technology or multiple process technologies. In this approach, the capacitors that couple the low voltage to high voltage domain switch an effective low voltage (5V) and this way keeps the overall power consumption low. The feedback signal provides a signal to generate a digital code that is proportional to the difference from the desired (targeted) dead time and the actual dead time and corrects by adjusting the delay elements associated with the high side and low side paths. The entire adjustment occurs in digital domain and the feedback loop for such correction is implemented using a mixed signal mode. The high side and low side signals propagate through the exact same blocks in order to eliminate duty cycle distortion. The differential implementation makes the entire approach immune to supply/GND noise. (motor drives, higher frequency also leads to fine resolution of dead time).

Figure 17:
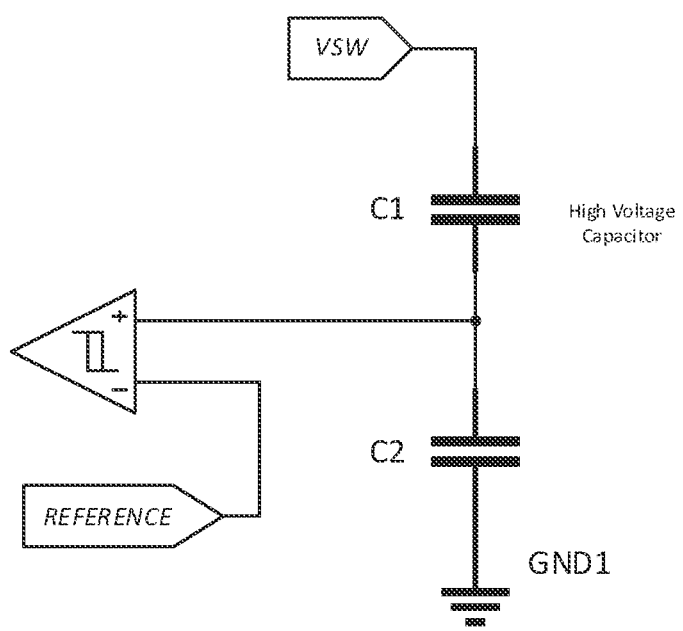
FIG. 17 depicts a schematic showing an embodiment of the sense circuit in FIG. 16.

FIG. 17 depicts a schematic showing an embodiment of the sense circuit in FIG. 16. The capacitor C1 can handle the higher voltage and the capacitance divider allows a scaled version of VSW (switching node) to be compared against a reference. The scaled version can be monitored in the low voltage domain.

Figure 18:
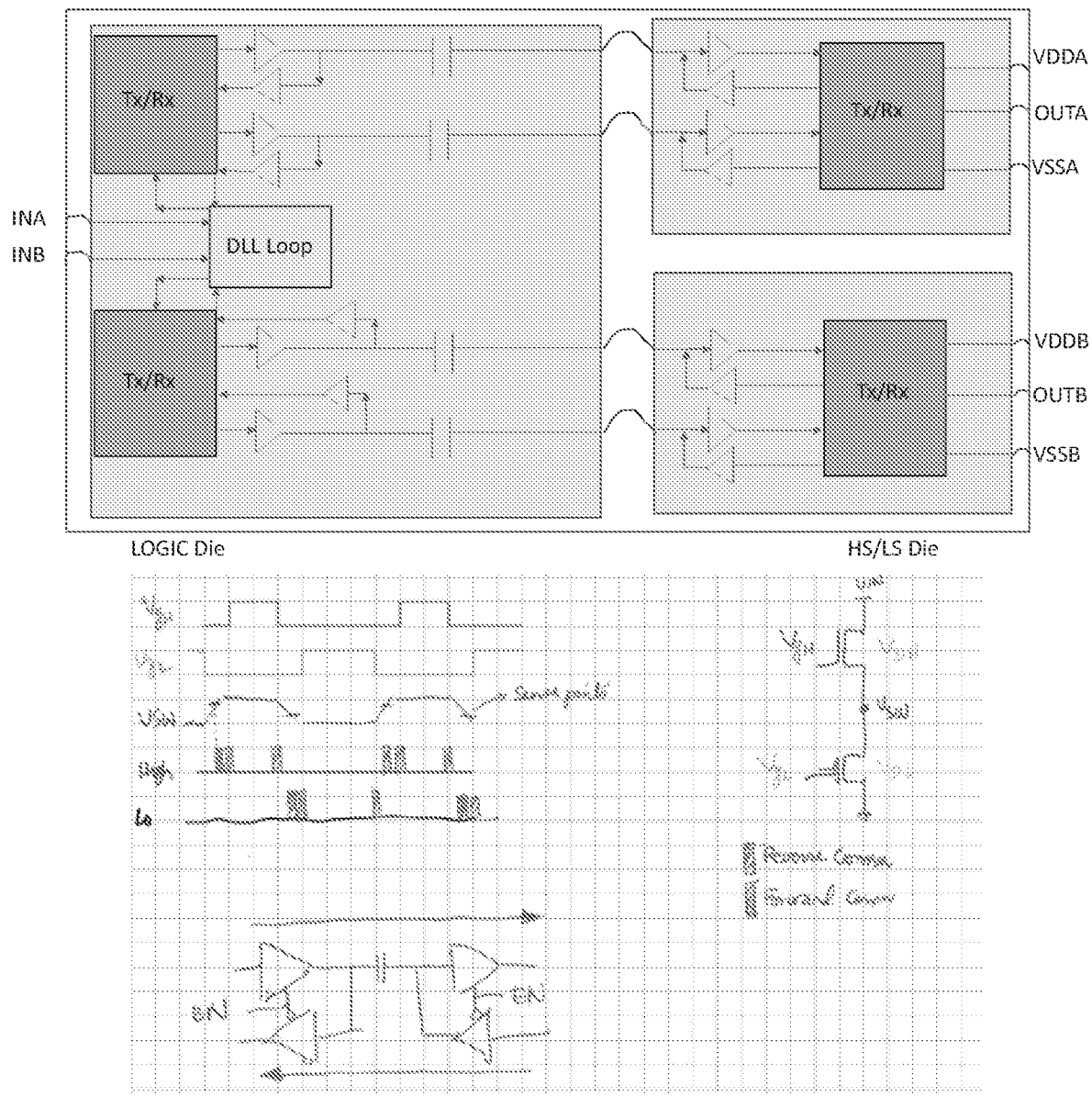
FIG. 18 provides an alternate implementation of the feedback loop that uses a time to digital conversion in accordance with one embodiment of the present invention.

FIG. 18 provides an alternate implementation of the feedback loop that uses a time to digital conversion in accordance with one embodiment of the present invention. A key component includes the monitoring element, which can monitor the delay between the two pulses in high side and low side and convert it to a digital word. The monitoring unit can be a voltage monitor, current monitor, a temperature sensor. It can use voltage, current or a combination of the two. The monitored signal is transmitted across the barrier to the controlling side to indicate the monitored variable. The control signal that is provided to the reference clock input of the timing element (PLL) is used for the feedback. The entire system is initially put in a RESET state which initializes the feedback loop.

Figure 19:
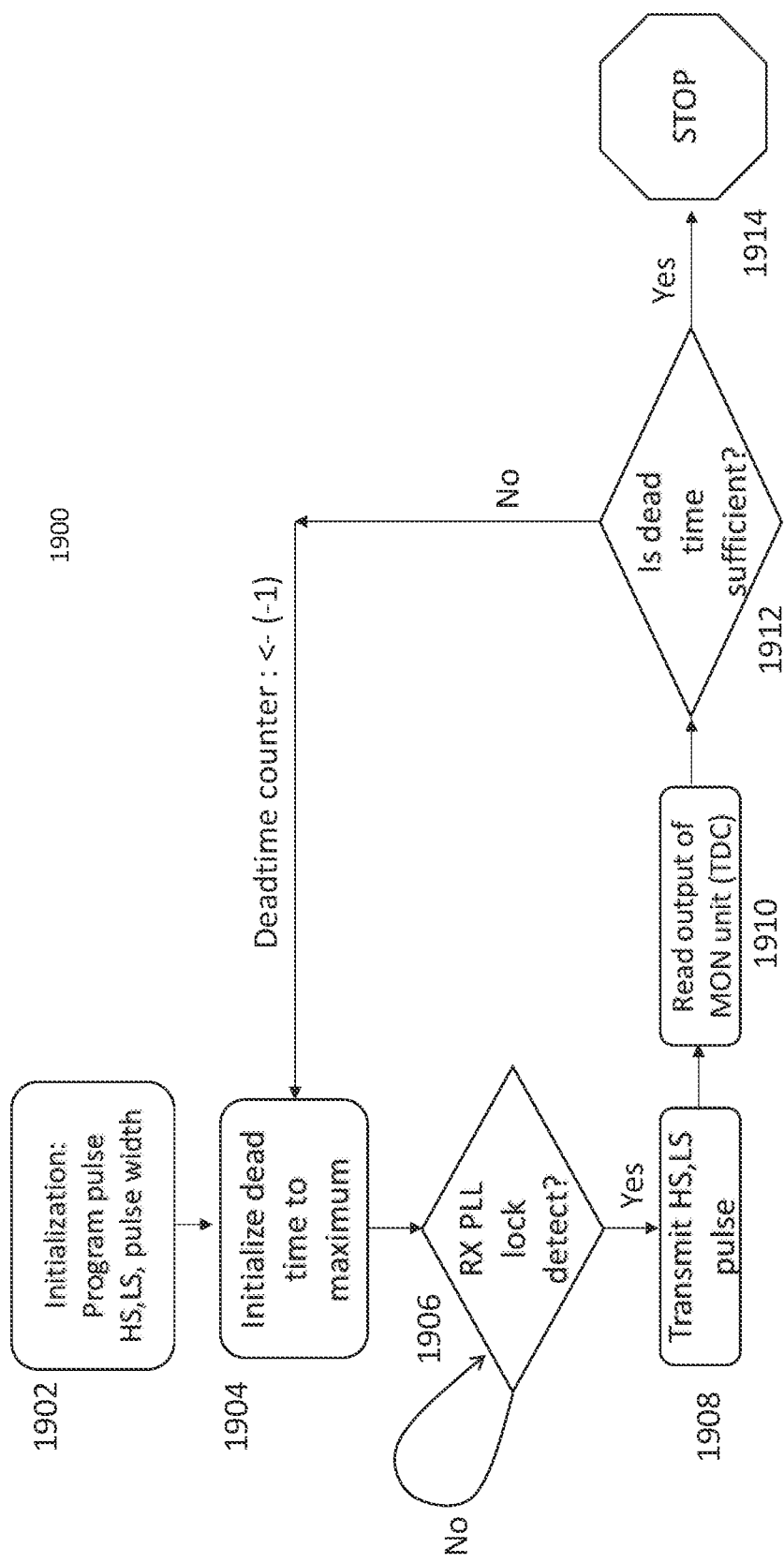
FIG. 19 provides a flow chart for operating the entire driver with precision control in accordance with one embodiment of the present invention.

FIG. 19 provides a flow chart 1900 for operating the entire driver with precision control in accordance with one embodiment of the present invention. First, the feedback loop of a PLL or FLL is initialized in terms of pulsewidth on the high side and low side of the power converter in block 1902. The pulse width of the high side and the low side determines the output voltage across the load. After the initialization procedure, a value (e.g., maximum, etc.) of the desired dead time is set to avoid cross conduction in the driver under all circumstances in block 1904. The timing control of the PLL or FLL is locked in block 1906 until the timing control reaches a steady state. Thereafter, the high side and low side pulses are transmitted in block 1908. The dead time is measured from the monitoring unit using one of the monitored variables in block 1910. The monitoring unit can use a detector in any one of the voltage domains and may contain a voltage/current/delay detection (using timing to digital conversion). The measured dead time is compared with the desired dead time in decision block 1912. If the measured dead time is not sufficient, as determined in decision block 1912, the delay in the timing control is adjusted to reduce a difference in the measured dead time and the desired dead time to approximately zero and the process repeats in block 1904. Otherwise, the process stops in block 1914. In an alternate embodiment, this entire dead zone control may be bypassed and a specific value of the dead time can be fixed for the desired load conditions. In such configuration, the control logic simply passes from block 1902 to block 1912 and stops at block 1914.

Figure 20:
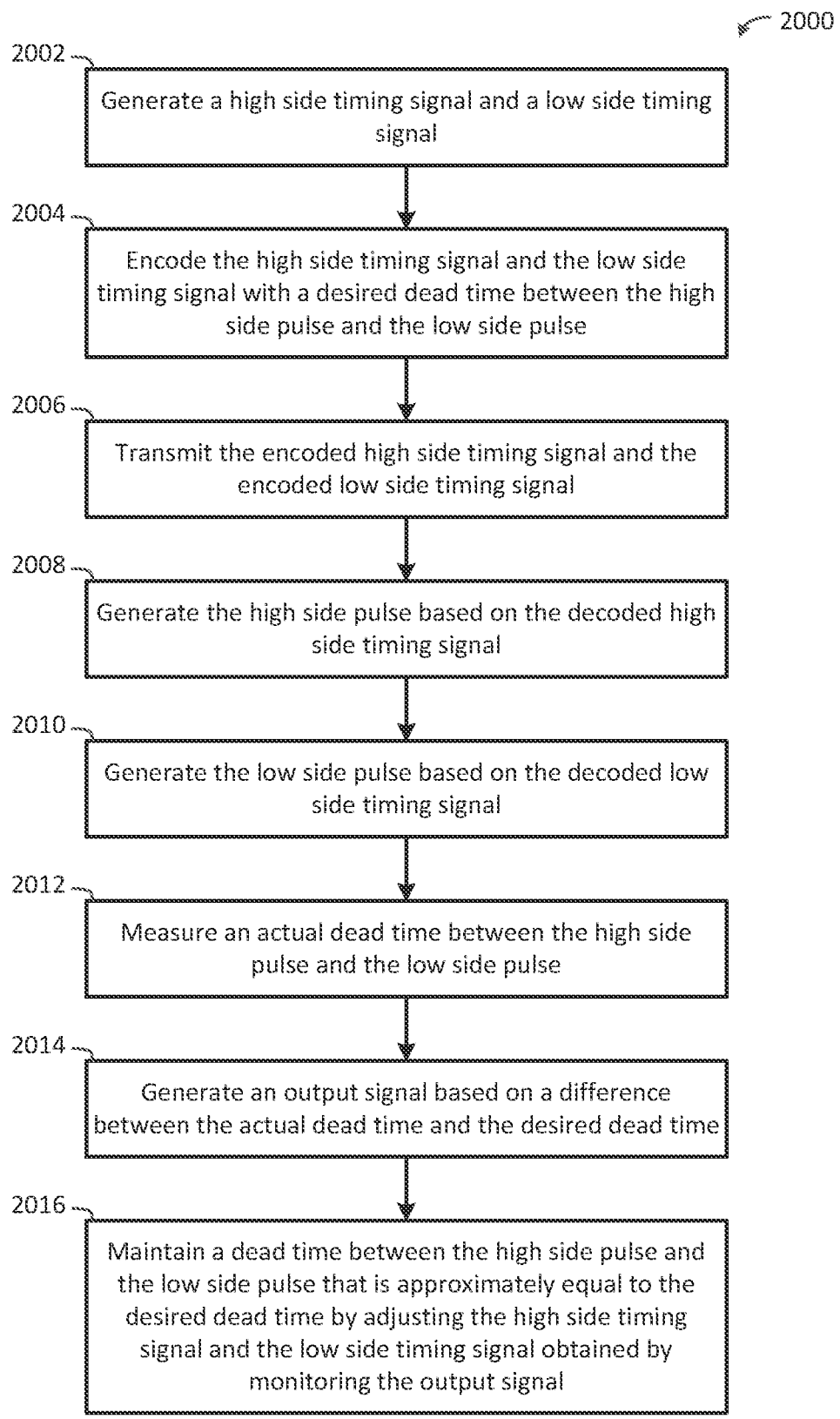
FIG. 20 provides a flow chart of a method for controlling a dead time between a high side pulse and a low side pulse of a power converter in accordance with one embodiment of the present invention.

FIG. 20 provides a flow chart of a method 2000 for controlling a dead time between a high side pulse and a low side pulse of a power converter in accordance with one embodiment of the present invention. A high side timing signal and a low side timing signal are generated in block 2002. The high side timing signal and the low side timing signal are encoded with a desired dead time between the high side pulse and the low side pulse in block 2004. The encoded high side timing signal is transmitted across an isolation barrier of the power converter in block 2006. The encoded high side timing signal and the encoded low side timing signal are decoded in block 2008. The high side pulse is generated based on the decoded high side timing signal in block 2010. The low side pulse is generated based on the decoded low side timing signal in block 2012. An actual dead time between the high side pulse and the low side pulse is measured in bock 2014. An output signal based on a difference between the actual dead time and the desired dead time is generated in block 2016. A dead time is maintained between the high side pulse and the low side pulse that is approximately equal to the desired dead time by adjusting the high side timing signal and the low side timing signal in block 2004 based on the output signal in block 2016.

In one aspect, the method does not adjust the high side timing signal and the low side timing signal until a timing control circuit reaches a steady state. In another aspect, the method varies a frequency of the high side timing signal and the low side timing signal over time. In another aspect, the high side pulse and the low side pulse are complementary, identical, or non-overlapping. In another aspect, the method maintains a slew rate of the high side pulse and the low side pulse approximately equal to a desired slew rate. In another aspect, the output signal comprises the actual dead time, an error between the actual dead time and the desired dead time, or a signal or a digital code proportional to the actual dead time or the difference between the actual dead time and the desired dead time. In another aspect, the method encodes a duty cycle, or a desired slew rate into the high side timing signal and the low side timing cycle. In another aspect, the method sets or adjusts the desired dead time, the duty cycle, or the desired slew rate. In another aspect, the method modulates the high side timing signal and the low side timing signal to have a duty cycle. In another aspect, the method controls a high side driver circuit using the high side pulse. In another aspect, power is provided to a load using the high side driver circuit. In another aspect, the method controls a low side driver circuit using the low side pulse. In another aspect, the method monitors at least a voltage around a high side switching circuit and a low side switching circuit, a current flowing through the high side switching circuit and the low side switching circuit, or a time varying voltage around the high side switching circuit and the low side switching circuit. In another aspect, the method is implemented using the power converter described above.

Figure 21:
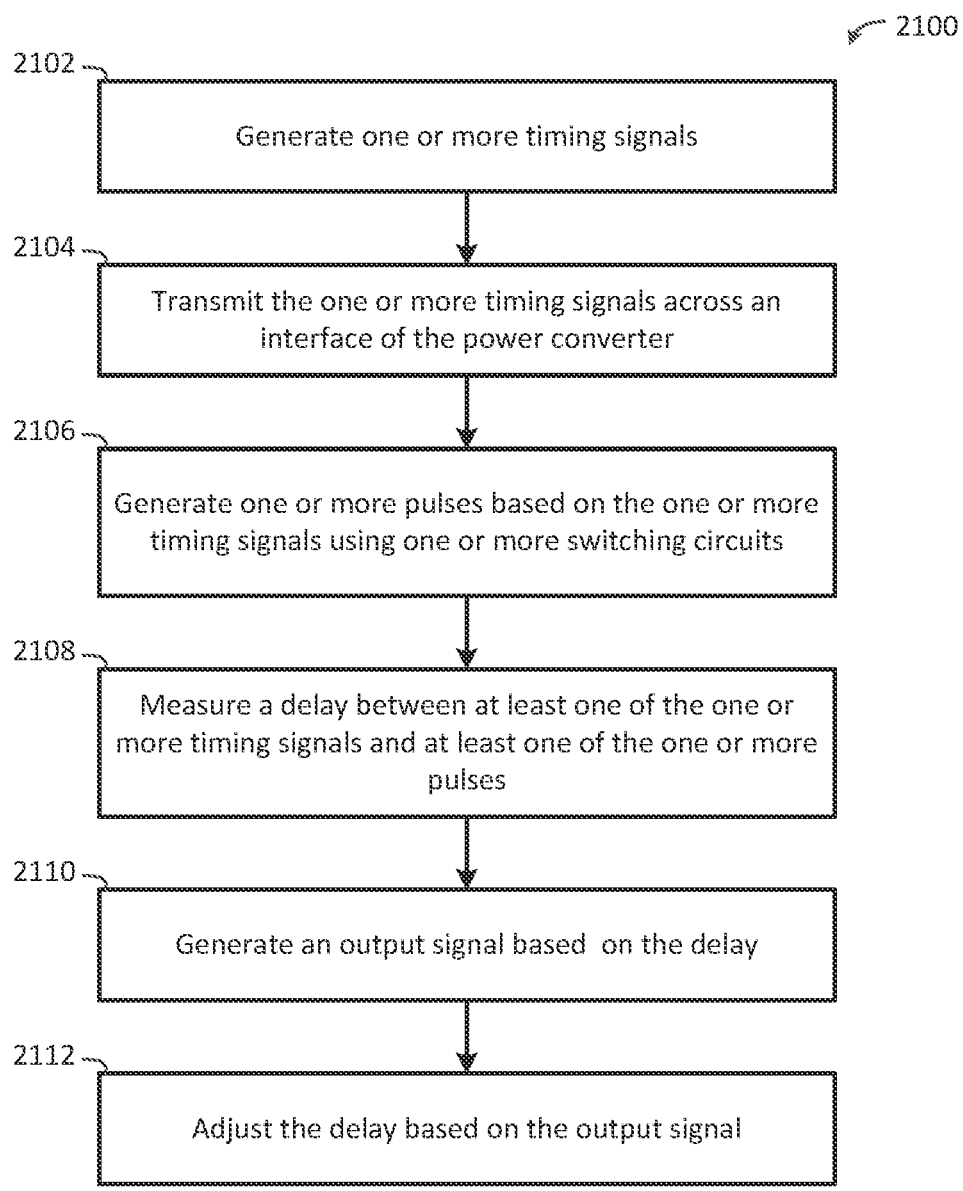
FIG. 21 provides a flow chart of a method for controlling a delay within a power converter in accordance with one embodiment of the present invention.

FIG. 21 provides a flow chart of a method 2100 for controlling a delay within a power converter in accordance with one embodiment of the present invention. One or more timing signals are generated in block 2102, and the one or more timing signals are transmitted across an interface of the power converter in block 2104. One or more pulses are generated based on the one or more timing signals using one or more switching circuits in block 2106. The delay between at least one of the one or more timing signals and at least one of the one or more pulses is measured in block 2108. An output signal is generated based on the delay in block 2110, and the delay is adjusted based on the output signal in block 2112. In one aspect, the method does not adjust the timing signal until a timing control circuit reaches a steady state. In another aspect, the method varies a frequency of the timing signal over time.

In another aspect, the pulses are complementary, identical, or non-overlapping. In another aspect, the method maintains a slew rate of the pulses approximately equal to a desired slew rate. In another aspect, the output signal comprises the actual dead time, an error between the actual dead time and the desired dead time, a signal or a digital code proportional to the actual dead time, or the difference between the actual dead time and the desired dead time. In another aspect, the method encodes a duty cycle, or a desired slew rate into the timing signal. In another aspect, the method sets or adjusts the desired dead time, the duty cycle, or the desired slew rate. In another aspect, the method modulates the timing signal to have a duty cycle. In another aspect, the method controls a driver circuit using the pulse. In another aspect, power is provided to a load using the driver circuit. In another aspect, the method monitors at least a voltage around the one or more switching circuits, a current flowing through the one or more switching circuits, or a time varying voltage around the one or more switching circuits. In another aspect, the method is implemented using the power converter described above.

Circuits can be implemented with, but are not limited to, single or combinations of discrete electrical and electronic components, integrated circuits, semiconductor devices, analog devices, digital devices, etc. Elements can be coupled together using any type of suitable direct or indirect connection between the elements including, but not limited to, wires, pathways, channels, vias, electromagnetic induction, electrostatic charges, optical links, wireless communication links, etc.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

In the specification, reference may be made to the spatial relationships between various components and to the spatial orientation of various aspects of components as the devices are depicted in the attached drawings. However, as will be recognized by those skilled in the art after a complete reading of the present application, the devices, members, apparatuses, etc. described herein may be positioned in any desired orientation. Thus, the use of terms such as "above," "below," "upper," "lower," or other like terms to describe a spatial relationship between various components or to describe the spatial orientation of aspects of such components should be understood to describe a relative relationship between the components or a spatial orientation of aspects of such components, respectively, as the device described herein may be oriented in any desired direction.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. In embodiments of any of the compositions and methods provided herein, "comprising" may be replaced with "consisting essentially of" or "consisting of" As used herein, the phrase "consisting essentially of" requires the specified integer(s) or steps as well as those that do not materially affect the character or function of the claimed invention. As used herein, the term "consisting" is used to indicate the presence of the recited integer (e.g., a feature, an element, a characteristic, a property, a method/process step, or a limitation) or group of integers (e.g., feature(s), element(s), characteristic(s), property(ies), method/process(s) steps, or limitation(s)) only.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

As used herein, words of approximation such as, without limitation, "about," "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12 or 15%.

All of the devices and/or methods disclosed and claimed herein can be made and executed without undue experimentation in light of the present disclosure. While the devices and/or methods of this invention have been described in terms of particular embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope, and concept of the invention as defined by the appended claims.

Furthermore, no limitations are intended to the details of construction or design herein shown, other than as described in the claims below. It is therefore evident that the particular embodiments disclosed above may be altered or modified and all such variations are considered within the scope and spirit of the disclosure. Accordingly, the protection sought herein is as set forth in the claims below.

Modifications, additions, or omissions may be made to the systems and apparatuses described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order.

To aid the Patent Office, and any readers of any patent issued on this application in interpreting the claims appended hereto, applicants wish to note that they do not intend any of the appended claims to invoke 35 U.S.C. § 112(f) as it exists on the date of filing hereof unless the words "means for" or "step for" are explicitly used in the particular claim.

What is claimed is:

1. A power converter comprising:
    a timing control circuit that generates one or more timing signals;
    an interface coupled to the timing control circuit;
    one or more switching circuits coupled to the interface that generate one or more pulses in response to the one or more timing signals;
    a monitoring circuit coupled to the one or more switching circuits and the timing control circuit, wherein the monitoring circuit measures a delay between at least one of the one or more timing signals and at least one of the one or more pulses, and generates an output signal based on the delay; and
    wherein the timing control circuit adjusts the delay obtained by monitoring the output signal.

2. The power converter of claim 1, wherein the monitoring circuit is coupled to the timing control circuit via the interface.

3. The power converter of claim 1, wherein the one or more pulses vary in amplitude, voltage level, frequency, phase, or duty cycle.

4. The power converter of claim 1, wherein the monitoring circuit measures the delay by measuring one or more electrical or thermal characteristics.

5. The power converter of claim 4, wherein:
    the one or more electrical characteristics comprise voltage amplitude, current, phase, frequency or voltage levels; and
    the one or more thermal characteristics comprise an electrical output from a temperature sensor.

6. The power converter of claim 1, wherein the monitoring circuit comprises two or more monitoring circuits that operate concurrently or sequentially.

7. The power converter of claim 1, wherein:
    the one or more timing signals comprise a high side timing signal and a low side timing signal;
    the one or more switching circuits comprise a high side switching circuit that generates a high side pulse in response to the high side timing signal, and a low side switching circuit that generates a low side pulse in response to the low side timing signal;
    the delay comprises one or more delays between the high side pulse and the low side pulse, the high side pulse and the high side timing signal, or the low side pulse and the low side timing signal; and
    the output signal comprises one or more output signals based on the one or more delays.

8. The power converter of claim 7, wherein the high side pulse and the low side pulses are complementary, identical, or non-overlapping.

9. The power converter of claim 7, wherein the high side switching circuit and the low side switching circuit use differential circuitry.

10. The power converter of claim 1, wherein the timing control circuit does not adjust the timing signal until the timing control circuit reaches a steady state.

11. The power converter of claim 1, wherein a frequency of the one or more timing signals vary over time.

12. The power converter of claim 1, wherein the timing control circuit maintains a slew rate of the one or more pulses approximately equal to a desired slew rate.

13. The power converter of claim 1, wherein the output signal from the monitoring circuit comprises an actual dead time, an error between the actual dead time and a desired dead time, a signal or a digital code proportional to the actual dead time or a difference between the actual dead time and the desired dead time.

14. The power converter of claim 1, wherein the timing control circuit encodes a desired dead time, a duty cycle, or a desired slew rate into the one or more timing signals.

15. The power converter of claim 14, wherein the desired dead time, the duty cycle, or the desired slew rate are adjustable on demand via a controller.

16. The power converter of claim 1, wherein the interface comprises an isolation barrier.

17. The power converter of claim 16, wherein the isolation barrier comprises a capacitor circuit, an inductor circuit or a radio-frequency based transmission circuit.

18. The power converter of claim 16, wherein the isolation barrier comprises:
    a first isolation circuit coupled between the timing control circuit and the one or more switching circuits; and
    a second isolation circuit coupled between the monitoring circuit and the timing control circuit.

19. The power converter of claim 1, wherein each of the one or more switching circuits comprises a pre-driver circuit coupled to a switch.

20. The power converter of claim 1, further comprising a load coupled to at least one of the one or more switching circuits.

21. The power converter of claim 1, wherein the monitoring circuit comprises a voltage level comparator, a current level comparator, a temperature sensor, or a capacitor divider.

22. The power converter of claim 1, wherein the monitoring circuit monitors at least a voltage around the one or more switching circuits, a current flowing through the one or more switching circuits, or a time varying voltage around the one or more switching circuits.

23. The power converter of claim 1, wherein the timing circuit comprises:
    a timing driver circuit coupled to the interface; and
    a linear or circular time to digital converter coupled to the timing driver circuit and the monitoring circuit via the interface.

24. The power converter of claim 23, wherein the timing driver circuit comprises:
    a phase or frequency locked loop; and
    an encoder coupled to the phase or frequency locked loop.

25. The power converter of claim 23, wherein the time to digital converter comprises a set of delay elements connected in cascade that produce a thermometer coded output that represents an actual delay.

26. The power converter of claim 1, wherein each of the one or more switching circuits contains a decoder or filter circuit.

27. The power converter of claim 26, wherein the decoder comprises a second phase or frequency locked loop that locks to the timing signal and uses a control voltage to delay the timing signal by one half period.

28. The power converter of claim 27, wherein:
    the phase or frequency locked loop comprises an input, a phase frequency divider coupled to the input, a charge pump coupled to the phase frequency divider, a loop filter coupled to the charge pump, an oscillator coupled to the loop filter, an output coupled to the oscillator, and a frequency divider coupled between the output and the input;
    the encoder comprises a buffer coupled to the output of the phase or frequency locked loop, a delay and logic circuit coupled to the buffer, and a comparator coupled to an output of the loop filter, an output of the time to digital converter, and the delay and logic circuit.

* * * * *